US011462610B2

(12) United States Patent
Choi et al.

(10) Patent No.: US 11,462,610 B2
(45) Date of Patent: Oct. 4, 2022

(54) METHODS OF FABRICATING CAPACITOR AND SEMICONDUCTOR DEVICE AND SEMICONDUCTOR DEVICES AND APPARATUS INCLUDING THE SAME

(71) Applicant: Samsung Electronics Co., Ltd., Suwon-si (KR)

(72) Inventors: Yoonyoung Choi, Seoul (KR); Byunghyun Lee, Hwaseong-si (KR); Byeongjoo Ku, Incheon (KR); Seungjin Kim, Hwaseong-si (KR); Sangjae Park, Seoul (KR); Jinwoo Bae, Yongin-si (KR); Hangeol Lee, Suwon-si (KR); Bowo Choi, Suwon-si (KR); Hyunsil Hong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 117 days.

(21) Appl. No.: 16/947,090

(22) Filed: Jul. 17, 2020

(65) Prior Publication Data
US 2021/0036101 A1    Feb. 4, 2021

(30) Foreign Application Priority Data
Jul. 30, 2019    (KR) .................. 10-2019-0092650

(51) Int. Cl.
*H01L 27/108*    (2006.01)
*H01L 49/02*    (2006.01)

(52) U.S. Cl.
CPC .............. *H01L 28/92* (2013.01); *H01L 28/56* (2013.01); *H01L 28/91* (2013.01)

(58) Field of Classification Search
CPC ......... H01L 28/92; H01L 28/56; H01L 28/91; H01L 28/90; H01L 27/10894;
(Continued)

(56) References Cited

U.S. PATENT DOCUMENTS 7,459,745 B2   12/2008   Lee et al.
7,723,202 B2   5/2010    Eto
(Continued)

FOREIGN PATENT DOCUMENTS

JP         2014220423      11/2014
KR      1020100120468      11/2010
(Continued)

OTHER PUBLICATIONS

Extended European Search Report corresponding to EP Patent Application No. 20188770.0; dated Dec. 4, 2020 (8 pages).

*Primary Examiner* — Omar F Mojaddedi
(74) *Attorney, Agent, or Firm* — Myers Bigel, P.A.

(57) ABSTRACT

Capacitor forming methods may include sequentially forming a first mold layer, a first support material layer, and a second mold layer on a substrate, forming a mask pattern on the second mold layer, forming a recess in the second mold layer, the first support material layer, and the first mold layer using the mask pattern as a mask, forming a lower electrode in the recess, removing the mask pattern by a dry cleaning process, reducing a width of an upper portion of the lower electrode, removing the first mold layer, forming a dielectric layer on a surface of the lower electrode, and forming an upper electrode on the dielectric layer.

18 Claims, 36 Drawing Sheets

(58) Field of Classification Search
CPC ......... H01L 27/10814; H01L 27/10852; H01L 27/1085; H01L 27/10805; H01L 27/10897
See application file for complete search history.

(56) References Cited

U.S. PATENT DOCUMENTS

| | | |
|---|---|---|
| 7,727,837 B2 | 6/2010 | Gruening-Von et al. |
| 7,869,189 B2 | 1/2011 | Choi et al. |
| 8,815,697 B2 | 8/2014 | Yoon et al. |
| 9,159,729 B2 | 10/2015 | Kim et al. |
| 9,263,536 B2 | 2/2016 | Kim et al. |
| 9,673,272 B2 | 6/2017 | Choi et al. |
| 2005/0104110 A1 | 5/2005 | Yeo et al. |
| 2011/0045650 A1 | 2/2011 | Maekawa |
| 2012/0125879 A1 | 5/2012 | Park et al. |
| 2014/0120683 A1* | 5/2014 | Kim ................. H01L 28/40 438/381 |
| 2014/0154863 A1* | 6/2014 | Seo ................. H01L 28/86 438/386 |
| 2017/0077102 A1* | 3/2017 | Kim ................. H01L 27/10823 |
| 2018/0166320 A1* | 6/2018 | Kim ................. H01L 27/10852 |
| 2019/0081134 A1* | 3/2019 | Chang ............... H01L 27/10852 |
| 2019/0206983 A1 | 7/2019 | Nam et al. |

FOREIGN PATENT DOCUMENTS

| | | |
|---|---|---|
| KR | 101060715 | 8/2011 |
| KR | 1020120050327 | 5/2012 |

\* cited by examiner

METHODS OF FABRICATING CAPACITOR AND SEMICONDUCTOR DEVICE AND SEMICONDUCTOR DEVICES AND APPARATUS INCLUDING THE SAME

CROSS-REFERENCE TO RELATED APPLICATION

This application claims the benefit of Korean Patent Application No. and Korean Patent Application No. 10-2019-0092650, filed on Jul. 30, 2019, in the Korean Intellectual Property Office, the disclosures of which are incorporated herein in their entirety by reference.

BACKGROUND

The inventive concept relates to a method of forming a capacitor, a method of forming a semiconductor device, a semiconductor device, and a semiconductor memory apparatus including the same, and more particularly, to a capacitor, a semiconductor device, and a semiconductor memory apparatus having superior electrical performance, and methods of easily fabricating the same.

To obtain superior performance of a memory device, improvement of the performance of a data storing device may be needed. In particular, for DRAM that stores data in a capacitor, the performance of a capacitor may affect the performance of a memory device.

SUMMARY

The inventive concept provides a method of easily forming a capacitor having superior performance.

The inventive concept provides a method of easily manufacturing a semiconductor device having superior performance.

The inventive concept provides a semiconductor device having superior performance and capable of being easily manufactured.

The inventive concept provides a semiconductor memory device having superior performance and capable of being easily manufactured.

According to some embodiments of the inventive concept, there are provided capacitor forming methods including sequentially forming a first mold layer, a first support material layer, and a second mold layer on a substrate, forming a mask pattern on the second mold layer, forming a recess in the second mold layer, the first support material layer, and the first mold layer using the mask pattern as a mask, forming a lower electrode in the recess, removing the mask pattern by a dry cleaning process, reducing a width of an upper portion of the lower electrode, removing the first mold layer, forming a dielectric layer on a surface of the lower electrode, and forming an upper electrode on the dielectric layer.

According to some embodiments of the inventive concept, there are provided methods of fabricating a semiconductor device. The method may include sequentially forming a first mold layer, a first support material layer, and a second mold layer on a substrate, forming a mask pattern on the second mold layer, forming a recess in the first mold layer, the first support material layer, and the second mold layer by patterning the first mold layer, the first support material layer, and the second mold layer using the mask pattern as a mask, forming a lower electrode in the recess, removing the mask pattern by a dry cleaning process to expose an upper portion of the lower electrode, reducing a width of the upper portion of the lower electrode, removing the first mold layer, forming a dielectric layer on a surface of the lower electrode, and forming an upper electrode on the dielectric layer.

According to some embodiments of the inventive concept, there are provided methods of fabricating a semiconductor device. The method may include forming a transistor including a gate structure and an impurity area on a substrate, forming, on the substrate, an interlayer insulating layer that covers the transistor and includes a contact plug electrically connected to the impurity area, sequentially forming a first mold layer, a first support material layer, and a second mold layer on the interlayer insulating layer, forming a mask pattern on the second mold layer, forming a recess in the first mold layer, the first support material layer, and the second mold layer using the mask pattern as a mask, forming a lower electrode material layer on an upper surface of the mask pattern and in the recess, forming a lower electrode by removing a portion of the lower electrode material layer until the upper surface of the mask pattern is exposed, removing the mask pattern by a dry cleaning process, reducing a width of an upper portion of the lower electrode, removing the first mold layer, forming a dielectric layer on a surface of the lower electrode, and forming an upper electrode on the dielectric layer.

According to some embodiments of the inventive concept, there are provided semiconductor devices including a transistor on a substrate, the transistor including a gate structure and an impurity area, a first interlayer insulating layer on the transistor and including a contact plug electrically connected to the impurity area, and a capacitor on the first interlayer insulating layer. The capacitor may include a lower electrode electrically connected to the contact plug, a dielectric layer covering a surface of the lower electrode, and an upper electrode on the dielectric layer. The lower electrode may include a body portion extending in a vertical direction that is perpendicular to an upper surface of the substrate and having a first horizontal width, and an upper portion on the body portion and having a second horizontal width that is narrower than the first horizontal width.

According to some embodiments of the inventive concept, there are provided semiconductor memory apparatus including a plurality of semiconductor memory devices on a cell area of a substrate. The semiconductor substrate may also include a peripheral area. The semiconductor memory apparatus may also include a peripheral circuit on the peripheral area. The cell area may include a center area and an edge portion between the center area and the peripheral area, and the lower electrodes have substantially the same vertical sizes within the center area.

BRIEF DESCRIPTION OF THE DRAWINGS

Example embodiments of the inventive concept will be more clearly understood from the following detailed description taken in conjunction with the accompanying drawings in which.

DETAILED DESCRIPTION

Figure 1:
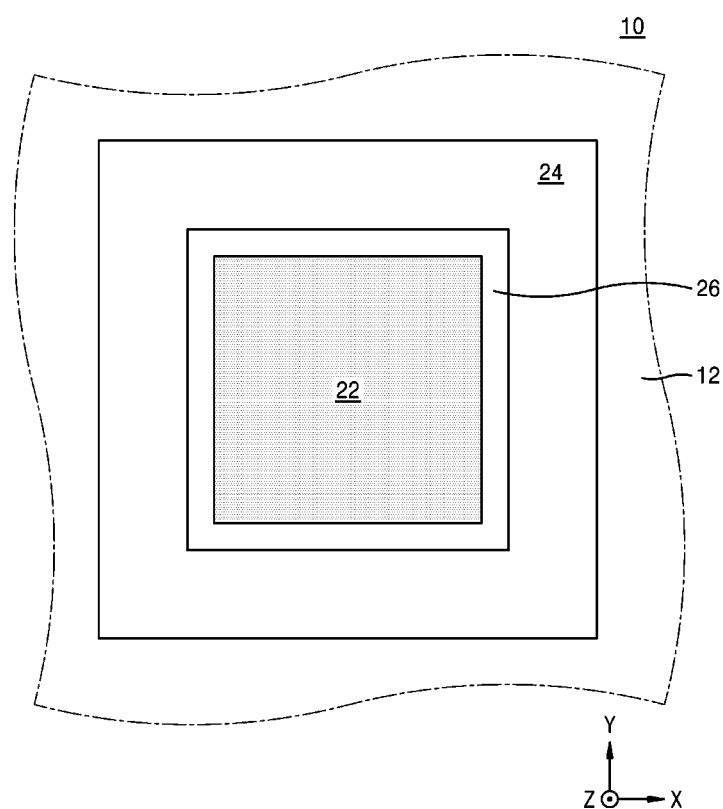
FIG. 1 is a schematic plan view of an integrated circuit device according to some embodiments of the inventive concept.

Some embodiments will now be described more fully with reference to the accompanying drawings. In the accompanying drawings, like reference numerals may refer to like elements, and repeated descriptions of the like elements may be omitted.

FIG. 1 is a plan view of a schematic structure of an integrated circuit device 10 according to some embodiments of the inventive concept.

The integrated circuit device 10 may include a substrate 12 that includes a first area 22, a second area 24 surrounding the first area 22, and an interface area 26 between the first area 22 and the second area 24.

The substrate 12 may include a semiconductor element such as Si or Ge, or at least one compound semiconductor selected from among SiGe, SiC, GaAs, InAs, and InP. The substrate 12 may include a conductive region, for example, an impurity-doped well or an impurity-doped structure.

In some embodiments, the first area 22 may be a memory cell area of the integrated circuit device 10. In some embodiments, the first area 22 may be a memory cell area of dynamic random access memory (DRAM). The first area 22 may include a unit memory cell including a transistor and a capacitor, or a unit memory cell including a switching device and a variable resistor.

The second area 24 may include a core area or a peripheral circuit area (hereinafter, referred to as the "peripheral circuit area"). Peripheral circuits for driving memory cells in the first area 22 may be disposed in the second area 24.

A plurality of conductive lines provided to enable an electric connection between the first area 22 and the second area 24 and insulating structures for insulation between the first area 22 and the second area 24 may be disposed in the interface area 26.

Figure 2:
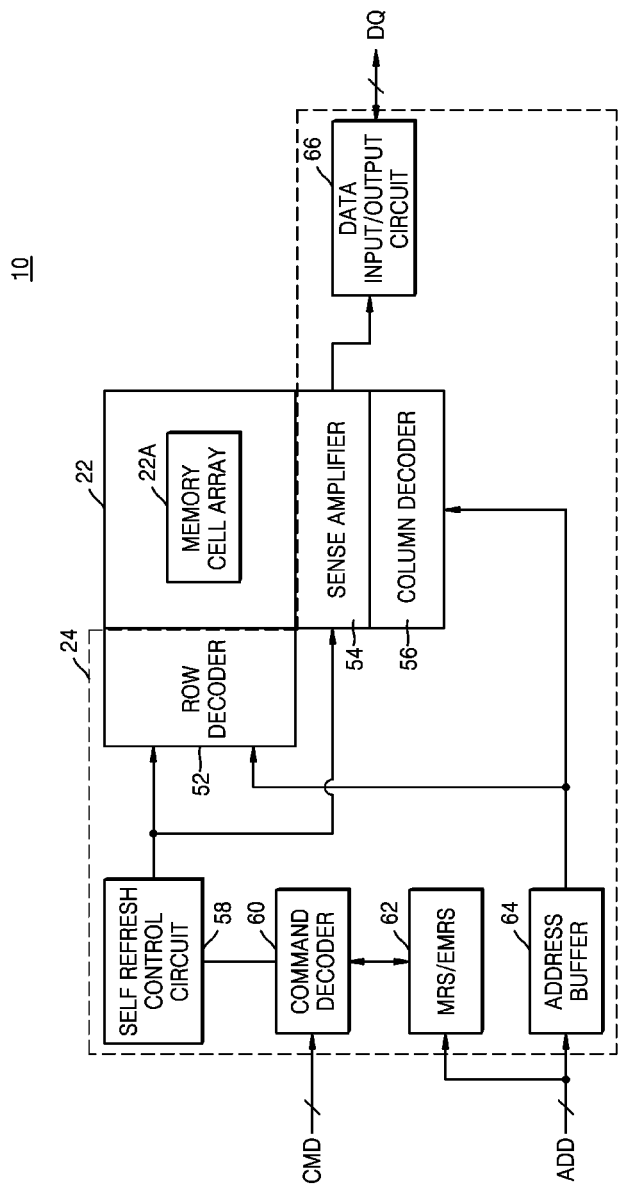
FIG. 2 is a block diagram of a structure of an integrated circuit device including a dynamic random access memory (DRAM) device according to some embodiments of the inventive concept.

FIG. 2 is a block diagram of a structure of an integrated circuit device including a DRAM device according to some embodiments of the inventive concept.

Referring to FIG. 2, in the integrated circuit device 10, the first area 22 may include a memory cell area of a DRAM device, and the second area 24 may include a peripheral circuit area of the DRAM device. The first area 22 may include a memory cell array 22A. In the memory cell array 22A, a plurality of memory cells for storing data may be arranged in a row direction and a column direction. Each of the plurality of memory cells may include a cell capacitor and an access transistor. A gate of the access transistor may be connected to a corresponding one of a plurality of word lines arranged in the row direction, one of a source and a drain thereof may be connected to a bit line or a complementary bit line arranged in the column direction, and the other may be connected to the cell capacitor.

The second area 24 may include a row decoder 52, a sense amplifier 54, a column decoder 56, a self refresh control circuit 58, a command decoder 60, a mode register set/extended mode register set (MRS/EMRS) circuit 62, an address buffer 64, and a data input/output circuit 66.

The sense amplifier 54 may sense and amplify data of the memory cells of the memory cell array 22A and may store the data in the memory cells. The sense amplifier 54 may be implemented by a cross-coupled amplifier connected between the bit line and the complementary bit line included in the memory cell array 22A.

Data DQ input via the data input/output circuit 66 may be written to the memory cell array 22A based on an address signal ADD, and data DQ read from the memory cell array 22A based on the address signal ADD may be output to the outside via the data input/output circuit 66. To designate a memory cell to or from which data is to be written or read, the address signal ADD may be input to the address buffer 64. The address buffer 64 may temporarily store an address signal ADD input from an external source.

The row decoder 52 may decode a row address from the address signal ADD output from the address buffer 64, in order to designate a word line connected to a memory cell to or from which data is input or output. In other words, the row decoder 52 may enable the word line by decoding the row address output from the address buffer 64 in a data write or read mode. The row decoder 52 may enable the word line by decoding a row address generated from an address counter in a self refresh mode.

The column decoder 56 may decode a column address from the address signal ADD output from the address buffer 64, in order to designate a bit line connected to the memory cell to or from which data is input or output. The memory cell array 22A may output data from the memory cell designated by the row and column addresses, or may write data to the memory cell.

The command decoder 60 may receive command signals CMD received from an external source and decode the received command signals CMD to internally generate decoded command signals, for example, a self refresh enter command or a self refresh exit command.

The MRS/EMRS circuit 62 may set an internal mode register in response to the address signal ADD and an MRS/EMRS command for designating an operation mode of the integrated circuit device 10.

Although not shown in FIG. 2, the integrated circuit device 10 may further include, for example, a clock circuit for generating a clock signal and a power circuit for receiving a power voltage from an external source and generating or distributing an internal voltage.

The self refresh control circuit 58 may control a self refresh operation of the integrated circuit device 10, in response to a command output by the command decoder 60. The command decoder 60 may include an address counter, a timer, and a core voltage generator. The address counter may generate a row address for designating a row address on which a self-refresh is to be performed, in response to the self refresh enter command output by the command decoder 60, and may apply the row address to the row decoder 52. The address counter may stop a counting operation in response to the self refresh exist command output by the command decoder 60.

Figure 3:
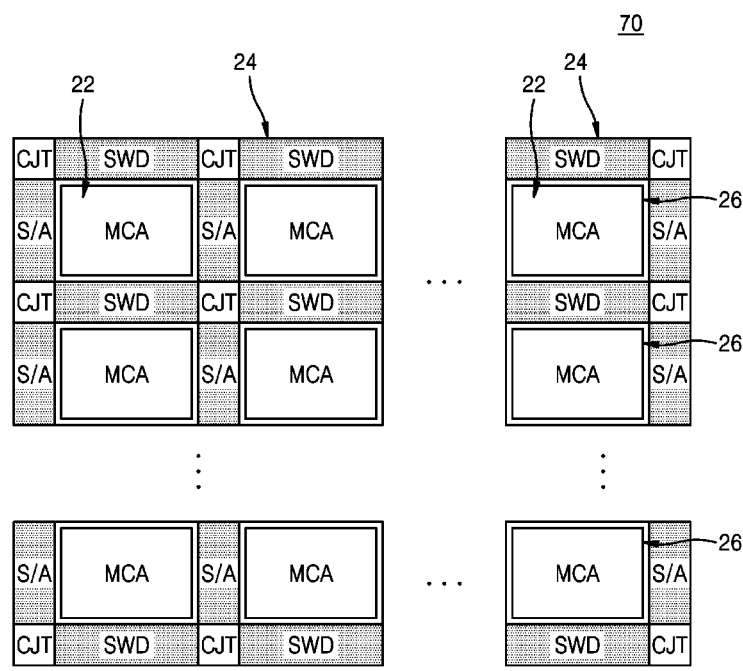
FIG. 3 is a plan view of a schematic configuration of an integrated circuit device according to some embodiments of the inventive concept.

FIG. 3 is a plan view of a schematic configuration of an integrated circuit device 70 according to some embodiments of the inventive concept.

Referring to FIG. 3, the integrated circuit device 70 may include a plurality of first areas 22. Each of the plurality of first areas 22 may be surrounded by the second area 24 with the interface area 26 therebetween. In the integrated circuit device 70, each of the plurality of first areas 22 may be a memory cell array area MCA of a DRAM device, and the second area 24 may be a peripheral circuit area of the DRAM device.

In the plurality of first areas 22, the memory cell array area MCA may include the memory cell array 22A described with reference to FIG. 2. Each of the plurality of first areas 22 may be surrounded by the interface area 26.

The second area 24 may include a sub-word line driver block SWD, a sense amplifier block S/A, and a conjunction block CJT. In the second area 24, a plurality of sub-word line driver blocks SWD may be arranged in a word line direction of the memory cell array area MCA, and a plurality of sense amplifier blocks S/A may be arranged in a bit line direction. A plurality of bit-line sense amplifiers may be arranged in the sense amplifier block S/A. The conjunction block CJT may be located at an intersection of the sub-word line driver block SWD and the sense amplifier block S/A. Power drivers for driving the bit-line sense amplifiers and ground drivers may be alternately arranged in the conjunction block CJT.

Although not illustrated in FIG. 3, a peripheral circuit such as an inverter chain or an input/output circuit may be further provided in the second area 24.

Figure 4:
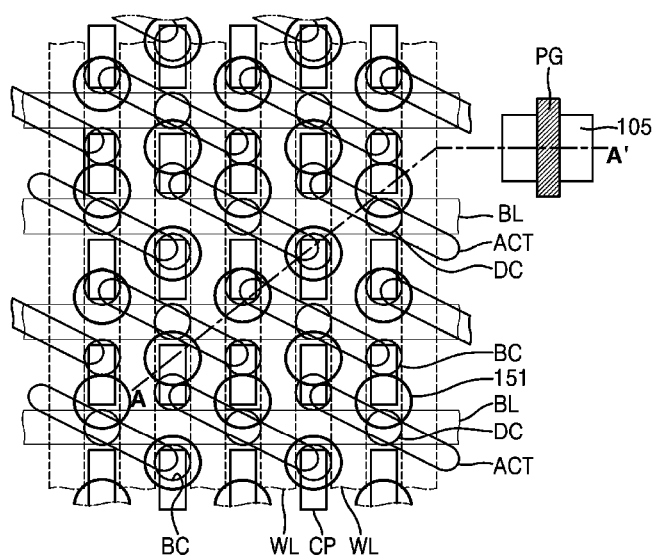
FIG. 4 is a plan view of a layout of a semiconductor device according to some embodiments of the inventive concept.
Figure 5:
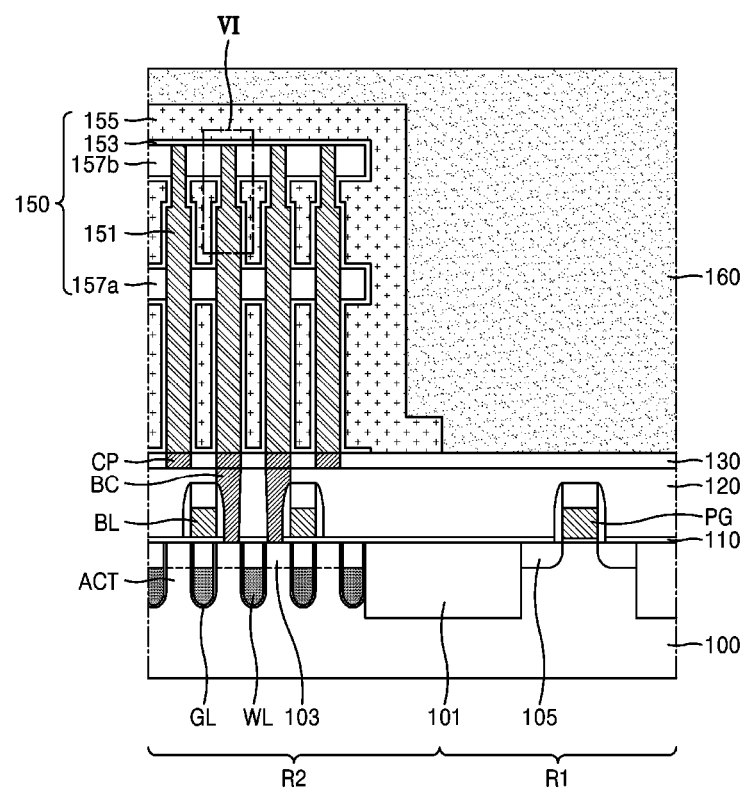
FIG. 5 is a side cross-sectional view taken along line A-A' of FIG. 4.

FIG. 4 is a plan view of a layout of a semiconductor device 1 according to some embodiments of the inventive concept. FIG. 5 is a side cross-sectional view taken along line A-A' of FIG. 4.

Referring to FIGS. 4 and 5, a semiconductor substrate 100 may include a first area R1 and a second area R2. For example, the first area R1 may include a peripheral circuit area, and the second area R2 may include a cell area.

In some embodiments, a peripheral circuit including row and column decoders, a page buffer, and an input/output circuit may be disposed on the first area R1 of the semiconductor substrate 100. In some embodiments, the peripheral circuit may include CMOS transistors, a resistor, and/or capacitors, which are electrically connected to the memory cell array. As used herein the term "and/or" includes any and all combinations of one or more of the associated listed items.

In some embodiments, a memory cell array including a plurality of memory cells may be disposed on the second area R2 of the semiconductor substrate 100. The memory cell array may include a plurality of memory cells and a plurality of word lines WL and bit lines BL electrically connected to the memory cells. In some embodiments, each of the memory cells may include a capacitor 150 that includes a lower electrode 151, an upper electrode 155, and a dielectric layer 153 therebetween. Furthermore, as a first support layer 157a and a second support layer 157b horizontally connect the lower electrodes 151 of the memory cells, the lower electrodes 151 may not be collapsed.

In detail, a device isolation layer 101 defining active areas ACT may be formed on the second area R2 of the semiconductor substrate 100. Each of the active areas ACT may have a bar shape, and the major axis of each of the active areas ACT may be disposed in a direction oblique to the word lines WL and the bit lines BL. In some embodiments, each of the active areas ACT may extend longitudinally in a direction that traverses the word lines WL and the bit lines BL as illustrated in FIG. 4.

The word lines WL may be disposed across the active areas ACT. In some embodiments, the word lines WL may be formed by providing a gate insulating layer GL in a recess area that is recessed to a certain depth from a surface of the active areas ACT. Furthermore, upper surfaces of the word lines WL may be located at a level lower than an upper surface of the active areas ACT, and the recess areas where the word lines WL are formed may be filled with an insulating material.

A plurality of impurity areas 103 such as a source area and a drain area may be formed in the active areas ACT at both sides of the word lines WL. The impurity areas 103 may form a plurality of MOS transistors with the word lines WL.

The bit lines BL may be disposed across the word lines WL on the first area R1 of the semiconductor substrate 100. A first interlayer insulating layer 110 may be between the bit lines BL and the semiconductor substrate 100. Bit line contact plugs DC electrically connecting the impurity areas 103 to the bit lines BL may be formed in the first interlayer insulating layer 110.

The first interlayer insulating layer 110 may include, for example, a high density plasma (HDP) oxide film, tetraethyl ortho silicate (TEOS), plasma enhanced TEOS (PE-TEOS), O3-TEOS, undoped silicate glass (USG), phospho silicate glass (PSG), borosilicate glass (BSG), borophosphosilicate glass (BPSG), fluoride silicate glass (FSG), spin on glass (SOG), tonen silazene (TOSZ), or a combination thereof. In some embodiments, the first interlayer insulating layer 110 may include a silicon nitride, a silicon oxynitride, or a low-k material having a low dielectric constant. A low-k material may have a dielectric constant lower than a dielectric constant of silicon dioxide.

Furthermore, the device isolation layer 101 may define a peripheral active area in the first area R1 of the semiconductor substrate 100. A peripheral gate electrode PG may be disposed across the peripheral active area, and peripheral source and drain areas 105 may be formed in the peripheral active area at both sides of the peripheral gate electrode PG.

A second interlayer insulating layer 120 may cover the bit lines BL of the first area R1 and the peripheral gate electrode PG of the second area R2. The second interlayer insulating layer 120 may include an HDP oxide film, TEOS, PE-TEOS, O3-TEOS, USG, PSG, BSG, BPSG, FSG, SOG, TOSZ or a combination thereof. Alternatively, the second interlayer insulating layer 120 may include a silicon nitride, a silicon oxynitride, or a low-k material having a low dielectric constant. "An element A covering an element B" (or similar language) as used herein means that the element A is on or overlaps the element B but does not necessarily mean that the element A covers the element B entirely.

A plurality of contact plugs BC electrically connecting a data storage element (that is, the capacitor 150) to the impurity areas 103 may be formed in the second interlayer insulating layer 120 of the second area R2. In some embodiments, the contact plugs BC may be disposed in the active areas ACT at both sides of each of the bit lines BL. Furthermore, the contact plugs BC may be arranged in the form of continuous regular triangles, a honeycomb, or zigzag, in a plan view.

Furthermore, the contact plugs BC may be formed by forming contact holes exposing the impurity areas 103 in the second interlayer insulating layer 120, depositing a conductive layer for burying the contact holes, and planarizing and node-separating the conductive layer. The contact plugs BC may include, for example, an impurity-doped polysilicon layer, a metal layer, a conductive metal nitride layer, and a metal silicide layer, or a combination thereof.

In some embodiments, a plurality of contact pads CP may be respectively formed on the contact plugs BC. The contact pads CP may be arranged two-dimensionally on the second interlayer insulating layer 120 of the second area R2. The contact pads CP may increase a contact area between the lower electrode 151 of the capacitor 150 formed thereon and each of the contact plugs BC. The contact pads CP may have a shape in which the two contact pads CP neighboring with respect to each of the bit lines BL therebetween extend in the opposite directions.

A third interlayer insulating layer 130 may be formed between the contact pads CP. The third interlayer insulating layer 130 may include, for example, an HDP oxide film, TEOS, PE-TEOS, O3-TEOS, USG, PSG, BSG, BPSG, FSG, SOG, TOSZ, or a combination thereof. In some embodiments, the third interlayer insulating layer 130 may include a silicon nitride, a silicon oxynitride, or a low-k material having a low dielectric constant.

The lower electrodes 151 of the capacitor 150 may be formed on the contact pads CP, respectively. In some embodiments, the lower electrodes 151 may be arranged in the form of continuous regular triangles, a honeycomb, or zigzag, in a plan view.

The lower electrodes 151, as a certain conductor, may include, for example, cobalt (Co), titanium (Ti), nickel (Ni), tungsten (W), molybdenum (Mo), platinum (Pt), ruthenium (Ru), iridium (Ir), titanium nitride (TiN), tantalum nitride (TaN), titanium aluminum nitride (TiAlN), tantalum aluminum nitride (TaAlN), titanium silicon nitride (TiSiN), tungsten nitride (WN), platinum oxide (PtO), ruthenium oxide (RuOx), iridium oxide ($IrO_x$), SRO ($SrRuO_3$), BSRO (($Ba,Sr)RuO_3$), CRO ($CaRuO_3$), LSCO (($La,Sr)CoO_3$), or a combination thereof. However, the material of the lower electrodes 151 is not limited to the materials above.

The lower electrodes 151 may be supported by the first support layer 157a and the second support layer 157b. The lower electrodes 151 may have a high aspect ratio of about 10 to about 40, and when the first and second support layers 157a and 157b are omitted, the lower electrodes 151 may fall to the side and collapse or may be in contact with the neighboring lower electrodes 151. Accordingly, the first and second support layers 157a and 157b are provided to support the lower electrodes 151, and the lower electrodes 151 may not fall to the side or collapse.

The dielectric layer 153 may be conformally formed on surfaces of the lower electrodes 151, and the upper electrode 155 may be formed on the dielectric layer 153. After the capacitor 150 is formed in the second area R2, a burying insulating layer 160 covering the first area R1 and the second area R2 may be formed.

Figure 6A:
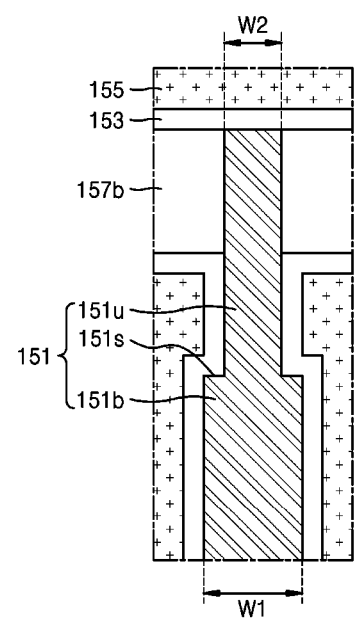
FIGS. 6A through 6C are side cross-sectional views of lower electrodes and second support layers according to some embodiments of the inventive concept.
Figure 6B:
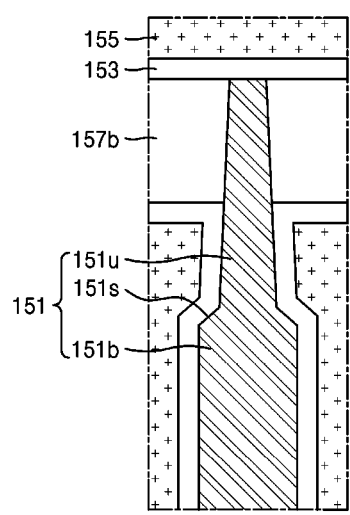
Figure 6C:
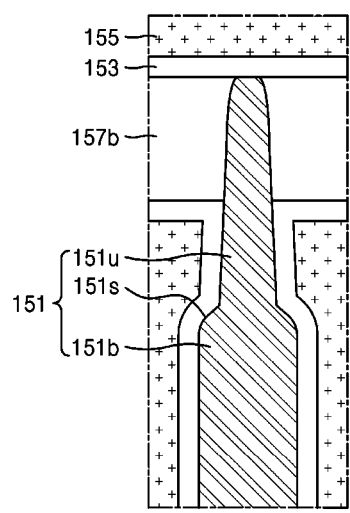

FIGS. 6A through 6C are side cross-sectional views of a lower electrode 151 and the second support layer 157b according to some embodiments of the inventive concept, and correspond to a region VI of FIG. 5.

Referring to FIG. 6A, the lower electrode 151 may include a body portion 151b and an upper portion 151u. The lower electrode 151 may have a shoulder portion 151s between the body portion 151b and the upper portion 151u. In other words, a size of the lower electrode 151 in a horizontal direction may discontinuously vary between the body portion 151b and the upper portion 151u. In some embodiments, the size of the lower electrode 151 in a horizontal direction may sharply vary between the body portion 151b and the upper portion 151u. The level of the shoulder portion 151s may be between an upper end of the lower electrode 151 and an upper surface of the first support layer 157a. The body portion 151b and the upper portion 151u may extend in a direction perpendicular to an upper surface of the semiconductor substrate 100.

The upper portion 151u may be supported by the second support layer 157b in an axial direction. In some embodiments, an upper surface of the second support layer 157b may be at a level that is substantially the same as the upper end of the lower electrode 151. The upper surface of the second support layer 157b may be on substantially the same plane as the upper end of the lower electrode 151. In some embodiments, the upper surface of the second support layer 157b and the upper end of the lower electrode 151 may be coplanar with each other as illustrated in FIG. 6A.

The body portion 151b may have a first horizontal size w1, and the upper portion 151u may have a second horizontal size w2. The first horizontal size w1 may be greater than the second horizontal size w2. In some embodiments, the second horizontal size w2 may be about 60% to about 90% of the first horizontal size w1. The first horizontal size w1 may refer to a width of the body portion 151b in a horizontal direction, and the second horizontal size w2 may refer to a width of the upper portion 151u in the horizontal direction. The horizontal direction may be parallel to the upper surface of the semiconductor substrate 100.

In some embodiments, the lower electrode 151 may be of a pillar type. In this case, the first horizontal size w1 may be a diameter of the body portion 151b, and the second horizontal size w2 may be a diameter of the upper portion 151u. In some embodiments, the lower electrode 151 may have a cylindrical shape. An element having a cylindrical shape may refer to an element that includes a bottom portion and a vertical portion protruding from the bottom portion in a vertical direction. The vertical portion of the element may have a width varying along its height direction.

Referring to FIG. 6B, a lateral surface of the upper portion 151u may form a slope with the upper surface of the semiconductor substrate 100. In contrast, the body portion 151b may include a lateral surface extending perpendicularly to the upper surface of the semiconductor substrate 100. The term "a lateral surface" may refer to "a side surface."

The body portion 151b may have the first horizontal size w1, and an upper end of the upper portion 151u may have the second horizontal size w2. In some embodiments, the upper end of the upper portion 151u may contact the dielectric layer 153 as illustrated in FIG. 6B. The first horizontal size w1 may be greater than the second horizontal size w2. A horizontal size of the upper portion 151u may decrease in a direction away from the body portion 151b. In some embodiments, the second horizontal size w2 may be about 60% to about 90% of the first horizontal size w1.

Referring to FIG. 6C, a lateral surface of the upper portion 151u may form a slope with the upper surface of the semiconductor substrate 100. The upper portion 151u of FIG. 6C may have a curved surface having a decreasing inclination as it is closer to an upper end thereof. In contrast, the body portion 151b may include a lateral surface extending perpendicularly to the upper surface of the semiconductor substrate 100. The shoulder portion 151s may also have a curved surface having a tangential inclination that varies according to locations.

An upper end of the upper portion 151u may not be a plane. In this case, the upper surface of the second support layer 157b may have a level that is substantially the same as the upper end of the lower electrode 151.

Although not shown in FIGS. 6A through 6C, in some embodiments, the shoulder portion 151s may be located at substantially the same level as the upper surface of the first support layer 157a. This will be described later in detail.

Figure 7:
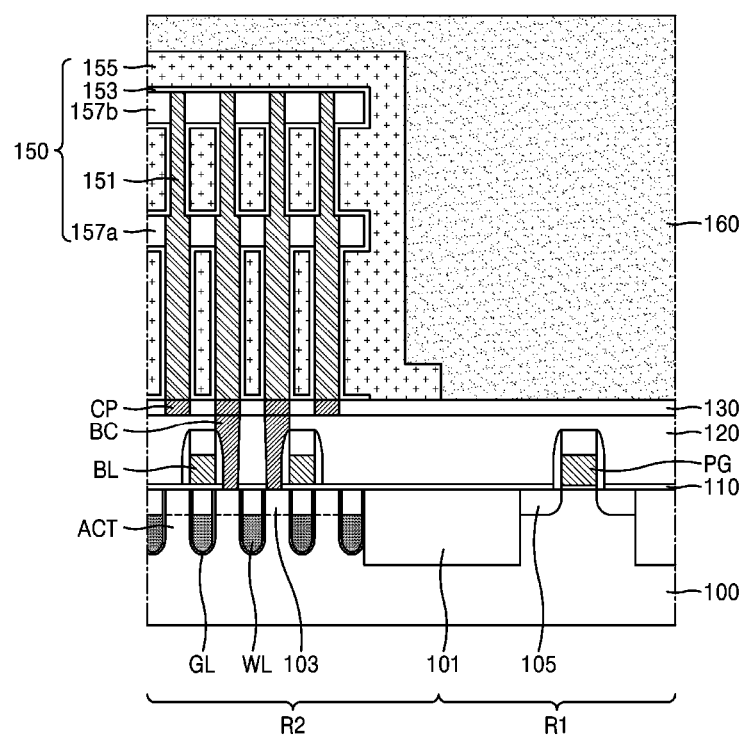
FIG. 7 is a side cross-sectional view taken along line A-A' of FIG. 4, according to some embodiments of the inventive concept.

FIG. 7 is a side cross-sectional view taken along line A-A' of FIG. 4, according to some embodiments of the inventive concept. The structure shown in FIG. 7 is different from the structure shown in FIG. 5 in that the level of the shoulder portion 151s (see FIGS. 6A through 6C) of the lower electrode 151 is substantially the same as the level of the upper surface of the first support layer 157a. This difference will now be mainly described.

Referring to FIG. 7, the level of the shoulder portion 151s may be substantially the same as the level of the upper surface of the first support layer 157a. In some embodiments, the shoulder portion 151s may not be completely horizontal. In this case, the level of the shoulder portion 151s may be represented by the level of an outermost circumference of the shoulder portion 151s (i.e., the level of a circumference formed where the lateral surface of the body portion 151b meets the shoulder portion 151s).

In some embodiments, the upper portion 151u may have a tapered shape in a direction away from the body portion 151b. In other words, the upper portion 151u may have a horizontal size that gradually decreases in a direction toward the top thereof. In some embodiments, the upper portion 151u may have a shape similar to that of the upper portion 151u in FIG. 6B. In other embodiments, the upper portion 151u may have a constant horizontal size. In some embodiments, the upper portion 151u may have a shape similar to that of the upper portion 151u in FIG. 6A.

Figure 8:
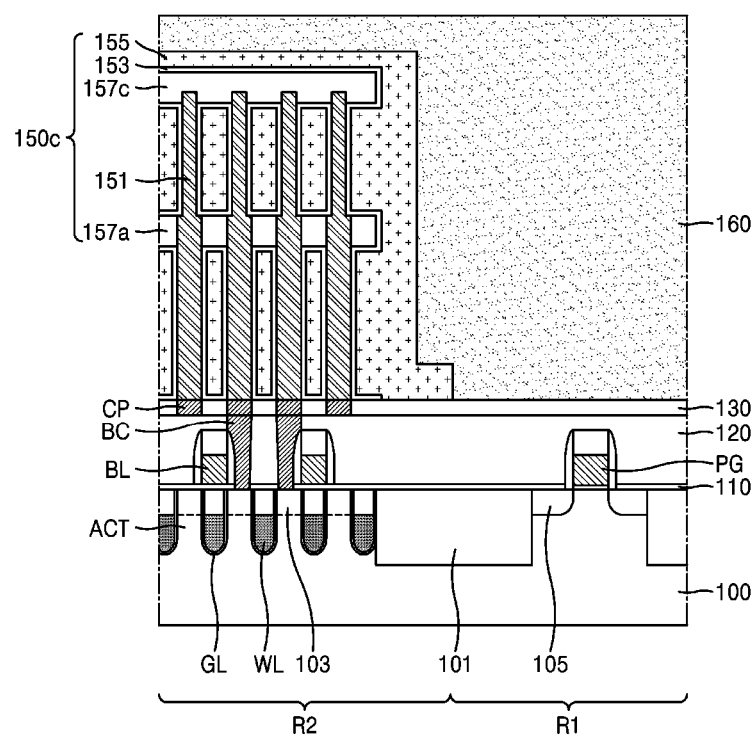
FIG. 8 is a side cross-sectional view taken along line A-A' of FIG. 4, according to some embodiments of the inventive concept.

FIG. 8 is a side cross-sectional view taken along line A-A' of FIG. 4, according to some embodiments of the inventive concept. The structure shown in FIG. 8 is different from the structure shown in FIG. 7 in terms of the location and shape of a second support layer 157c. This difference will now be mainly described.

Referring to FIG. 8, the second support layer 157c may cover upper surfaces of the lower electrodes 151 and portions of lateral surfaces of the upper portions 151u of the lower electrodes 151. In detail, the second support layer 157c may directly contact the upper surfaces of the lower electrodes 151. Furthermore, the second support layer 157c may extend in a vertical direction to contact portions of the lateral surfaces of the lower electrodes 151 that are connected to the upper surfaces of the lower electrodes 151.

Because the second support layer 157c of FIG. 8 supports the lateral surfaces of the lower electrodes 151 while contacting the upper surfaces of the lower electrodes 151, an area of the second support layer 157c in contact with the lateral surfaces of the lower electrodes 151 may secure at least a sufficient lateral intensity, compared with the embodiment of FIG. 7. In other words, because the second support layer 157c has a reduced area in contact with the lateral surfaces of the lower electrodes 151 and an area saved according to the reduced area may be used to increase a capacitance, the electrical performance of a memory device may be improved.

Figure 9:
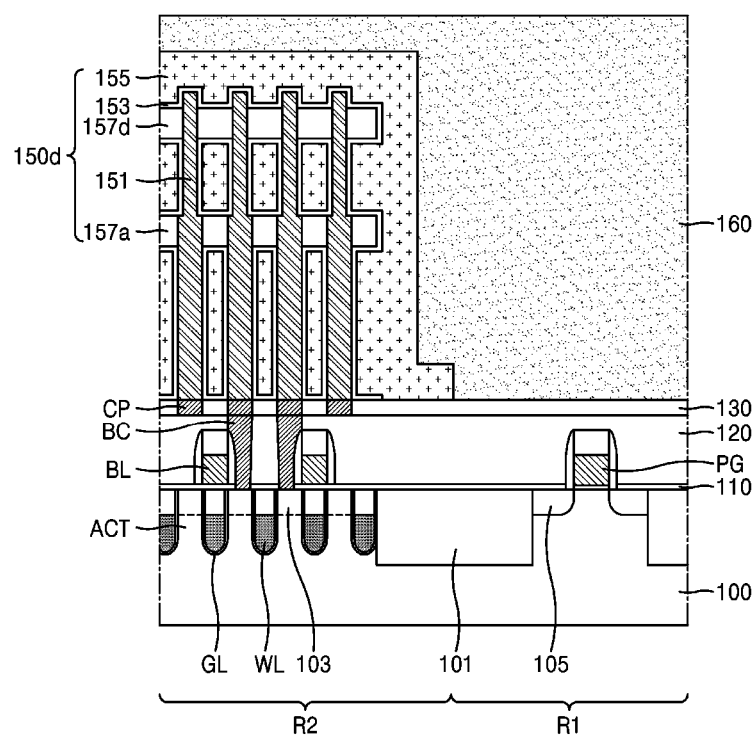
FIG. 9 is a side cross-sectional view taken along line A-A' of FIG. 4, according to some embodiments of the inventive concept.

FIG. 9 is a side cross-sectional view taken along line A-A' of FIG. 4, according to some embodiments of the inventive concept. The structure shown in FIG. 9 is different from the structure shown in FIG. 7 in terms of the location and shape of a second support layer 157d. This difference will now be mainly described.

Referring to FIG. 9, the second support layer 157d may be arranged such that upper ends of the lower electrodes 151 penetrate through the second support layer 157d and protrude from an upper surface of the second support layer 157d. In detail, the upper surface of the second support layer 157d is not on the same plane as the upper surfaces of the lower electrodes 151, and a level of the upper surfaces of the lower electrodes 151 in the vertical direction is higher than that of the upper surface of the second support layer 157d in the vertical direction. This structure may provide a larger process margin during manufacturing and may be easily manufactured.

Figure 10A:
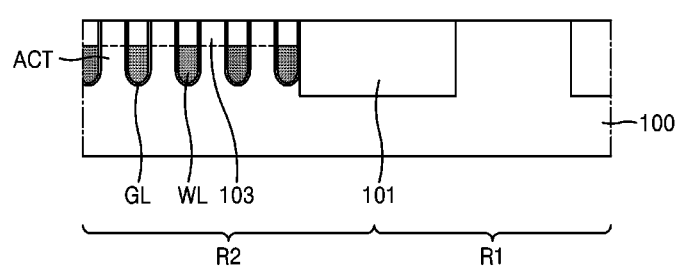
FIGS. 10A through 10P are side cross-sectional views illustrating a method of fabricating a semiconductor device according to some embodiments of the inventive concept.
Figure 10B:
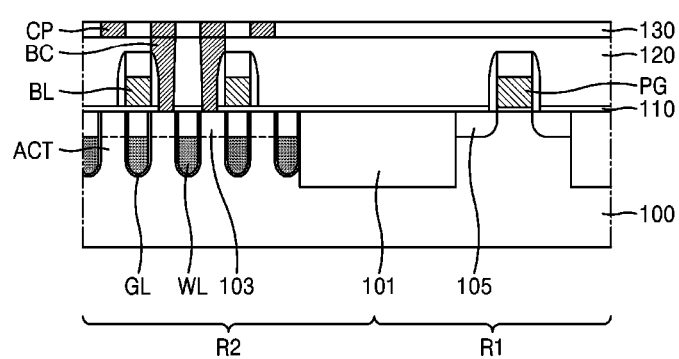
Figure 10C:
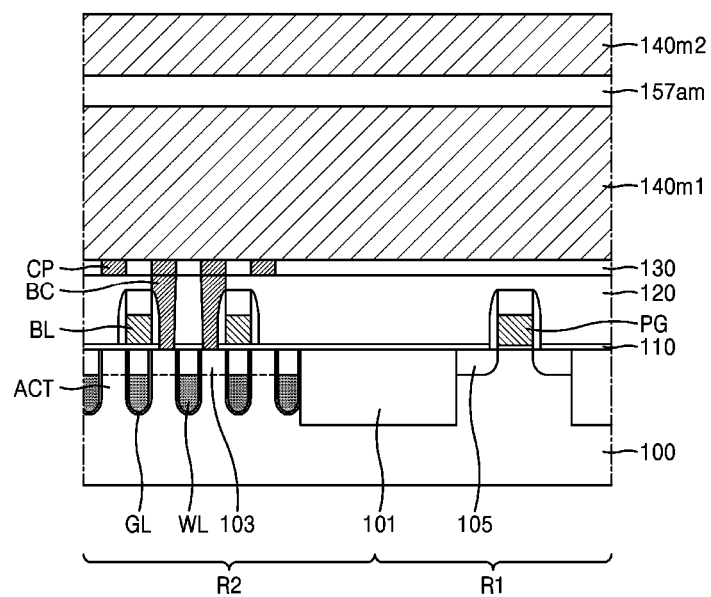
Figure 10D:
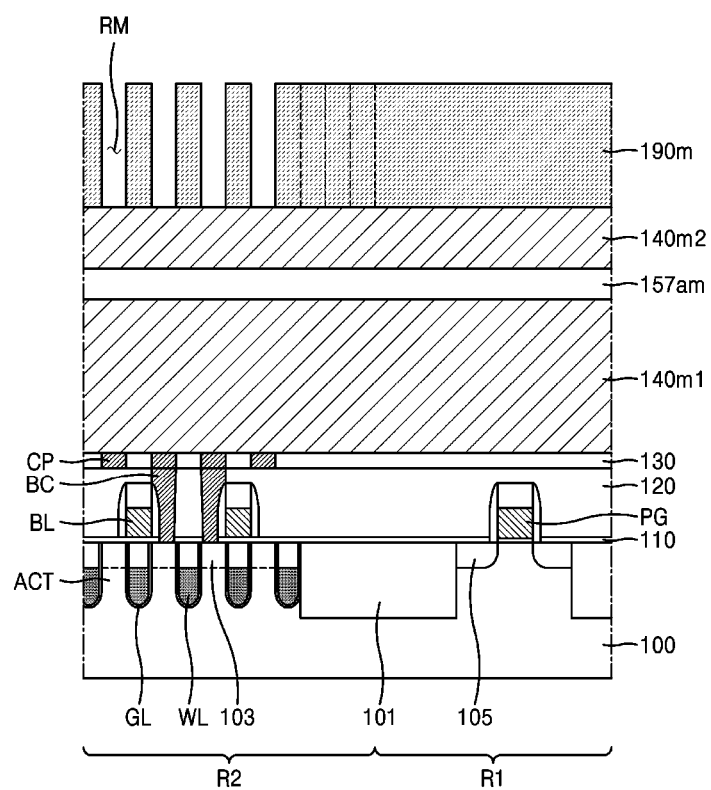
Figure 10E:
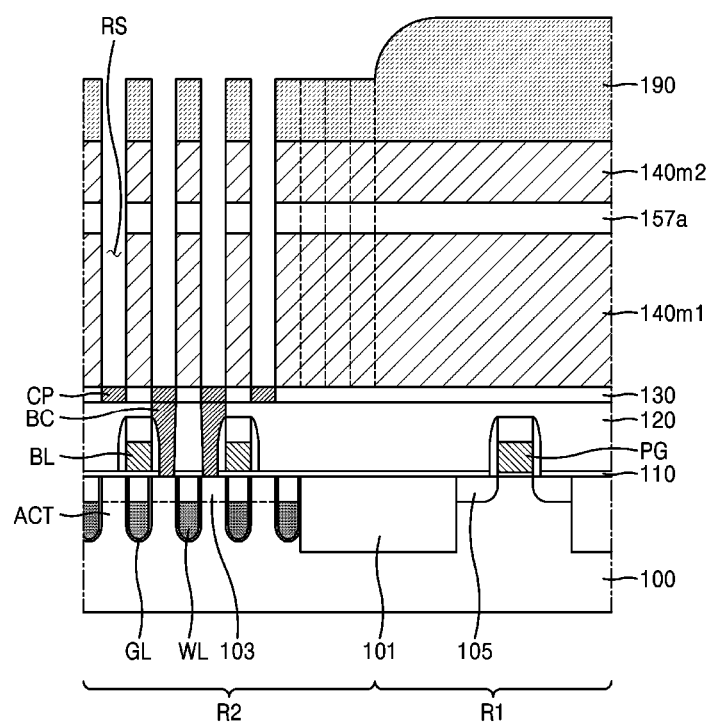
Figure 10F:
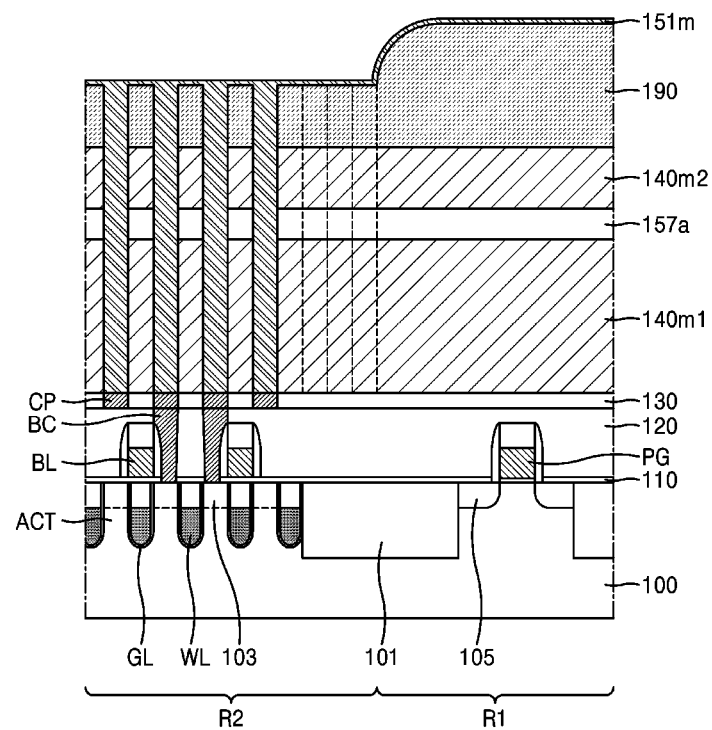
Figure 10G:
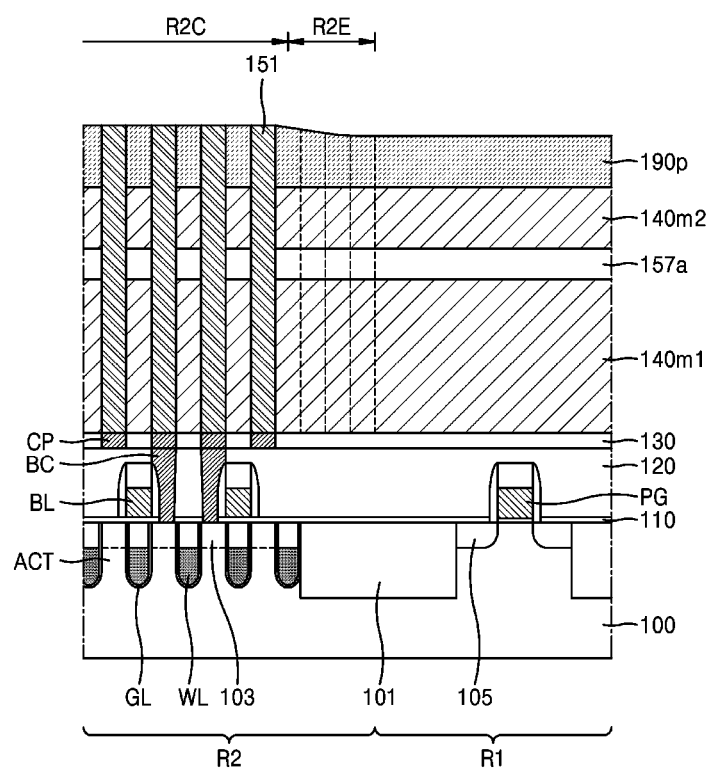
Figure 10H:
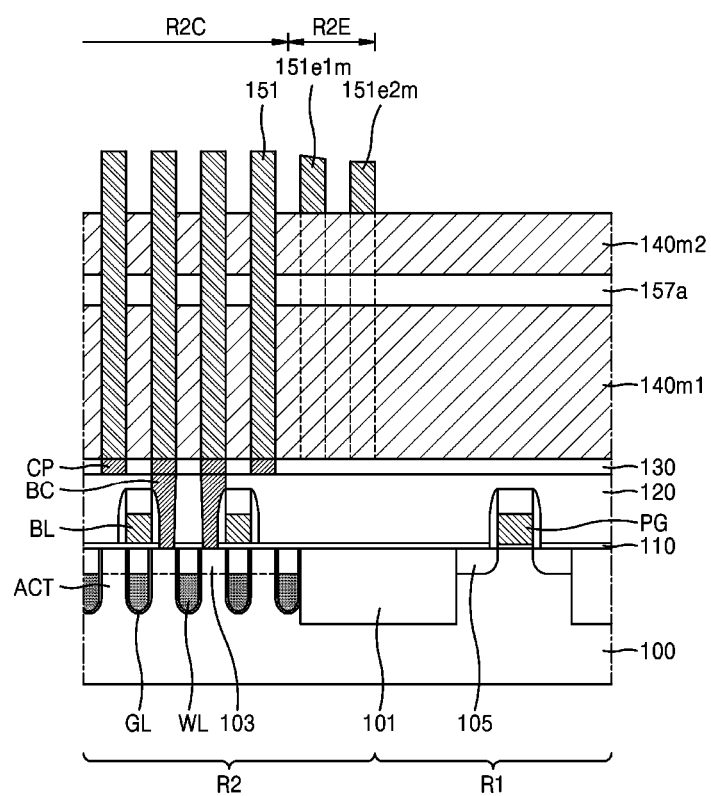
Figure 10I:
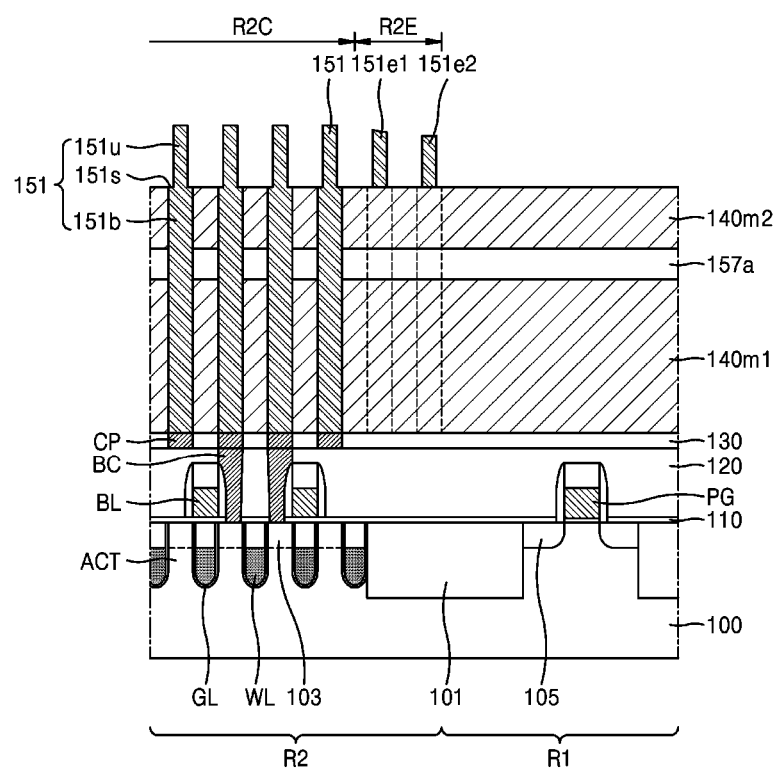
Figure 10J:
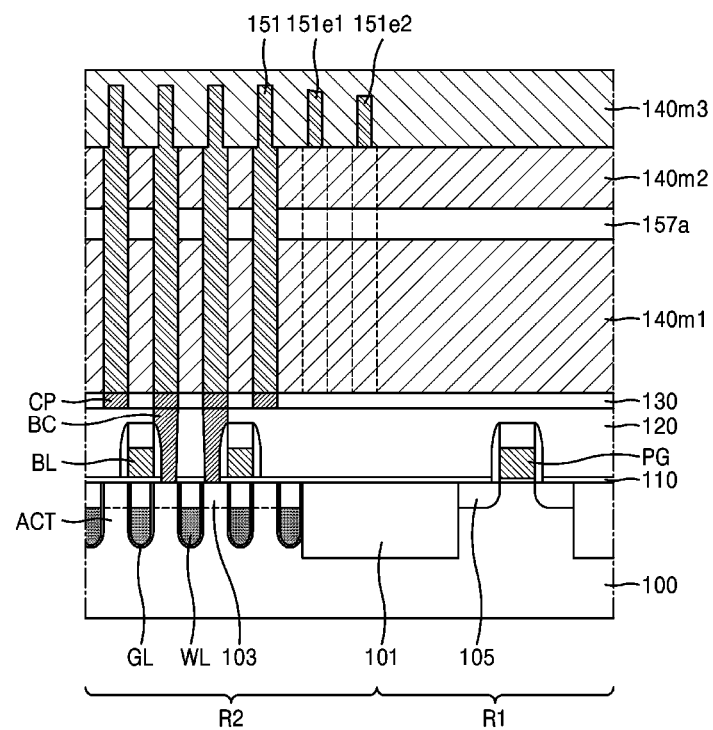
Figure 10K:
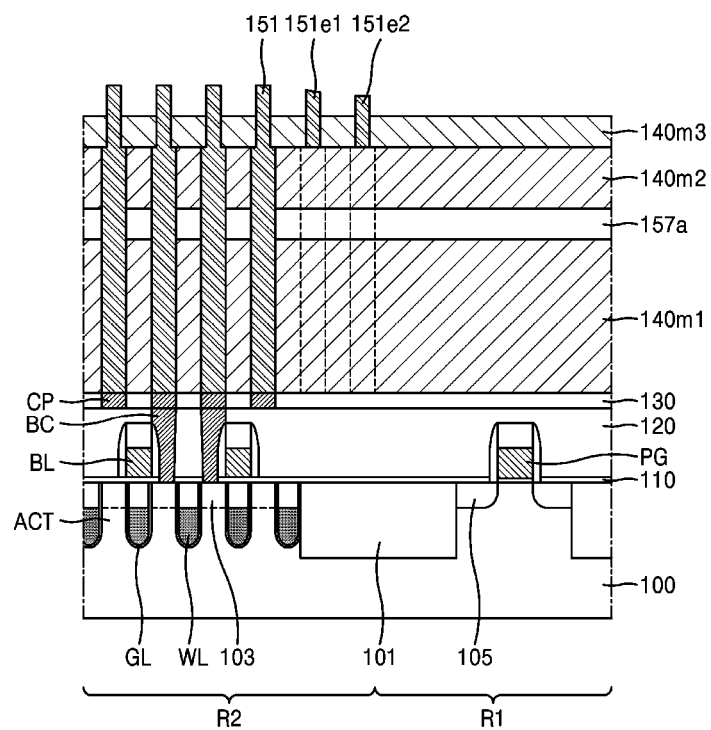
Figure 10L:
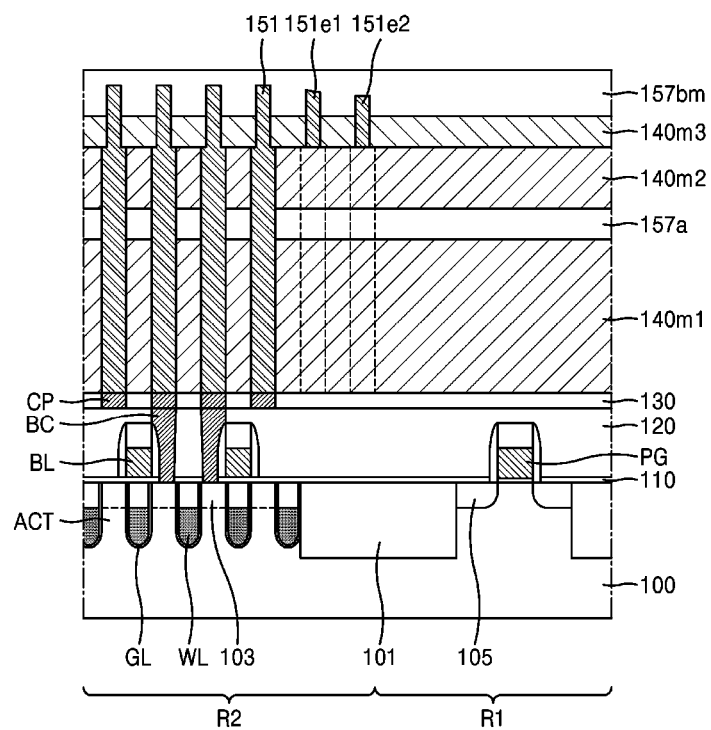
Figure 10M:
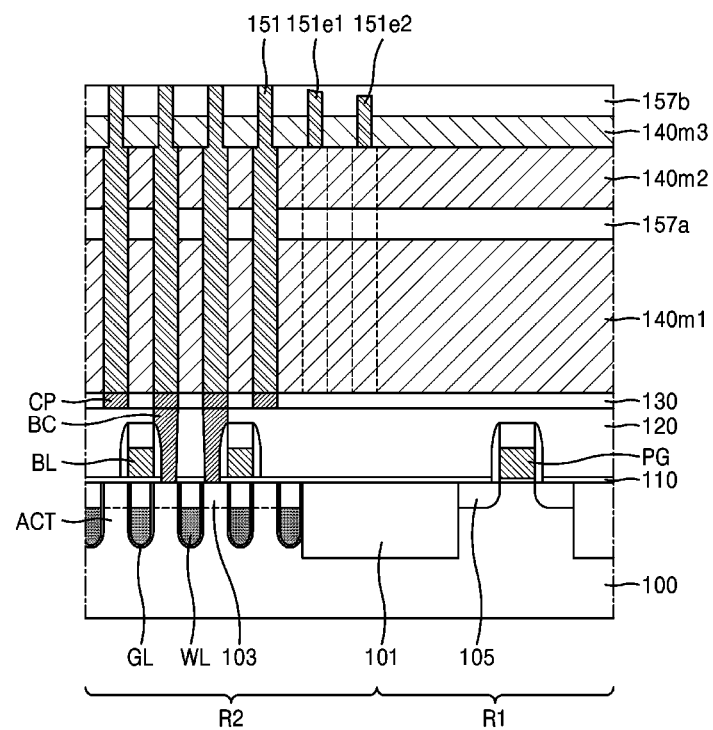
Figure 10N:
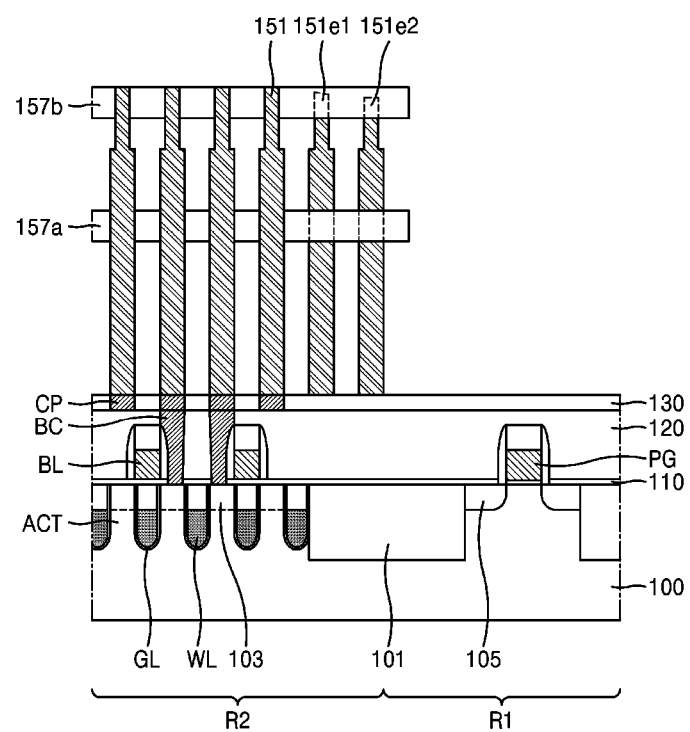
Figure 100:
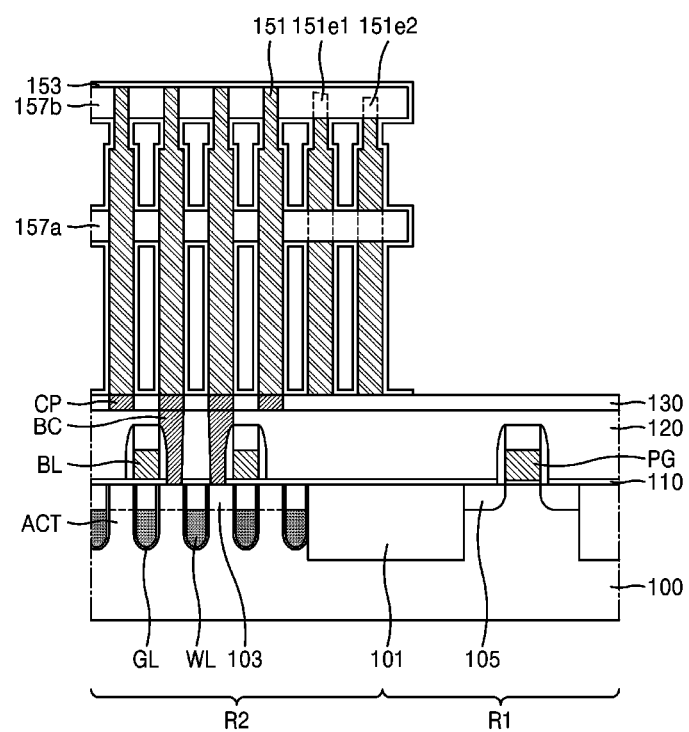
Figure 10P:
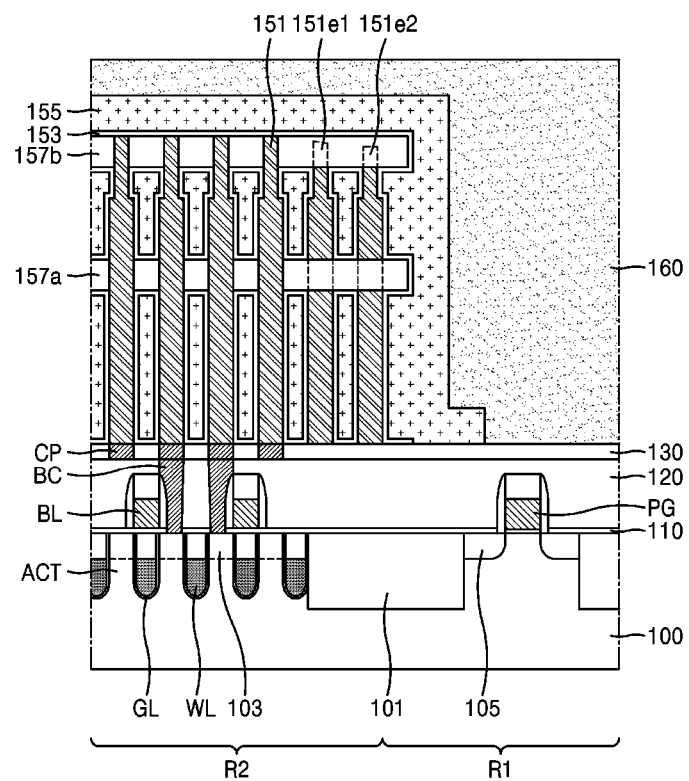

FIGS. 10A through 10P are side cross-sectional views illustrating a method of fabricating a semiconductor device, according to some embodiments of the inventive concept.

Referring to FIG. 10A, the semiconductor substrate 100 including the first area R1 and the second area R2 may be provided. As the semiconductor substrate 100 is described above in detail with reference to FIG. 5, a description thereof is omitted.

The active area ACT may be defined by forming the device isolation layer 101 in the semiconductor substrate 100. A gate insulating layer GL and the word lines WL may be formed after a recess extending across the active area ACT is formed. A capping layer including an insulating material may be formed above the word lines WL. Also, an impurity area 103 may be formed by injecting impurities into the active area ACT at both sides of each of the word lines WL. The impurity area 103 may serve as a source area or a drain area. The word lines WL and the source area and the drain area may constitute a transistor.

Referring to FIG. 10B, the first interlayer insulating layer 110 may be formed to cover the active areas ACT. The first interlayer insulating layer 110 may be provided with a bit line contact plug DC that may be electrically connected to the bit lines BL later. The first interlayer insulating layer 110 may include, for example, a silicon oxide.

Furthermore, the peripheral gate electrode PG may be formed in the first area R1, and a transistor for a peripheral circuit area may be provided by forming an impurity area 105 at both sides of the gate electrode PG.

After the bit lines BL are formed to be electrically connected to the bit line contact plug DC, the second interlayer insulating layer 120 may be formed to cover the bit lines BL. The contact plugs BC may be provided in the second interlayer insulating layer 120. The contact plugs BC may penetrate the first interlayer insulating layer 110 and the second interlayer insulating layer 120 to be electrically connected to the impurity area 103.

Each of the contact plugs BC and the bit line contact plugs DC may independently include, for example, doped polysilicon, metal, a conductive metal nitride, a metal silicide, or a combination thereof.

In FIG. 10B, although the bit line contact plugs DC connected to the bit lines BL are not seen, when one of ordinary skill in the art takes another appropriate cross-section different from the cross-section of FIG. 10B, the bit line contact plugs DC connected to the bit lines BL may be seen.

Next, the third interlayer insulating layer 130 covering the second interlayer insulating layer 120 may be formed. The contact pads CP may be provided in the third interlayer insulating layer 130. The contact pads CP may be in contact with the contact plugs BC. In FIG. 10B, the contact pads CP that are not in contact with the contact plugs BC may be those that are electrically connected to the contact plugs BC located farther from the cross-section in a direction of sight.

Referring to FIG. 10C, a first mold layer 140m1, a first support material layer 157am, and a second mold layer 140m2 may be sequentially formed on the third interlayer insulating layer 130.

Each of the first and second mold layers 140m1 and 140m2 may include, for example, a silicon oxide, and may be formed, for example, by chemical vapor deposition (CVD). For example, each of the first and second mold layers 140m1 and 140m2 may independently include a high density plasma (HDP) oxide film, tetraethyl ortho silicate (TEOS), plasma enhanced TEOS (PE-TEOS), O3-TEOS, undoped silicate glass (USG), phospho silicate glass (PSG), borosilicate glass (BSG), borophosphosilicate glass (BPSG), fluoride silicate glass (FSG), spin on glass (SOG), tonen silazene (TOSZ), or a combination thereof.

The thickness of each of the first and second mold layers 140m1 and 140m2 may be defined by a distance from a lower surface of each of the first and second mold layers 140m1 and 140m2 to an upper surface thereof and may be determined by taking into account the height of a capacitor lower electrode that is to be formed. For example, the thickness of each of the first and second mold layers 140m1 and 140m2 may be about 200 nm to about 4000 nm.

The first support material layer 157am may include a material having a sufficient etch selectivity with respect to the first and second mold layers 140m1 and 140m2. Also, when an etching atmosphere used to remove the first and second mold layers 140m1 and 140m2 in a subsequent process, for example, a lift-off process using an etchant including ammonium fluoride ($NH_4F$), hydrofluoric acid (HF), and water, may be used, the first support material layer 157am may include a material having a relatively low etch rate with respect to the etchant.

For example, the first support material layer 157am may include at least one of SiN, SiCN, SiGe, TaO, and $TiO_2$. In some embodiments, the first support material layer 157am may be formed by performing a deposition process such as chemical vapor deposition (CVD) or physical vapor deposition (PVD). In some embodiments, the first support material layer 157am may have a multi-layered structure. For example, the first support material layer 157am may have a multi-layered structure in which at least two of a SiN layer, a SiCN layer, a SiGe layer, a TaO layer, and a $TiO_2$ layer are sequentially stacked.

The first support material layer 157am may have a thickness of, for example, about 100 nm to about 1000 nm.

Referring to FIG. 10D, a mask pattern 190m may be formed on the second mold layer 140m2. In some embodiments, the mask pattern 190m may be a hard mask pattern. In some embodiments, the mask pattern 190m may include, for example, polysilicon, a silicon nitride, a silicon oxide, a silicon oxynitride, a spin-on-hard mask (SOH), an amorphous carbon layer (ACL), or a combination thereof.

The mask pattern 190m may be obtained by forming a layer of a mask pattern material film and then applying a photolithography method thereto. In detail, a layer of a mask pattern material film is formed and a photoresist pattern is formed thereon by a photolithography method. Then, the layer of the mask pattern material film is patterned using the photoresist pattern as an etch mask, thereby forming the mask pattern 190m. After obtaining the mask pattern 190m, the photoresist pattern may be removed by a method such as ashing.

The mask pattern 190m may have a higher pattern density in the second area R2 than in the first area R1. In FIG. 10D, a plurality of recess patterns RM of the mask pattern 190m are illustrated to be formed in the mask pattern 190m of the second area R2. Furthermore, in FIG. 10D, the recess patterns RM the mask pattern 190m that are formed in a portion of the second area R2 close to the first area R1 but not seen in the cross-section are indicated by a dashed line. The term "recess pattern" may refer to an opening or a gap.

Referring to FIG. 10E, recess patterns RS may be formed at a position where a lower electrode is to be formed, by patterning the first mold layer 140m1, the first support material layer 157a, and the second mold layer 140m2 using the mask pattern 190m as an etch mask. The recess patterns RS may expose the contact pads CP, respectively. When no contact pads CP are formed, the recess patterns RS may expose the contact plugs BC at a position corresponding to the lower electrode.

The recess patterns RS may be formed by, for example, anisotropic etching. The anisotropic etching may be performed by a method, for example, HDP etching, reactive ion etching, sputter etching, or reactive ion beam etching. However, the inventive concept is not limited to these methods.

The width of each of the recess patterns RS may be constant along its height direction, or may increase in a direction away from the semiconductor substrate 100. In some embodiments, the width of each of the recess patterns RS may decrease in a direction away from the semiconductor substrate 100. In some embodiments, the width of each of the recess patterns RS in the horizontal direction may be uniform along its height direction as illustrated in FIG. 10E or may increase or decrease along its height direction.

A mask pattern 190 having a shape shown in FIG. 10E may be obtained by partially removing an upper portion of the mask pattern 190m due to anisotropic etching for forming the recess patterns RS. As shown in FIG. 10E, it may be seen that a larger height or amount of the mask pattern 190 is removed in the second area R2 than in the first area R1.

Although the inventive concept is not intended to be limited to a specific theory, a height difference of the mask pattern 190 according to the area may be based on a loading effect. In detail, in the first area R1 in which a pattern density is relatively low, the mask pattern 190m of FIG. 10D appears to have a relatively two-dimensional removal, whereas, in the second area R2 in which the pattern density is relatively high, the mask pattern 190m of FIG. 10D appears to have a relatively three-dimensional removal. Accordingly, a removal rate of the mask pattern 190m in the second area R2 may be faster than that of the mask pattern 190m in the first area R1. As a result, the thickness of the mask pattern 190 in the first area R1 may be greater than that of the mask pattern 190 in the second area R2.

The mask pattern 190 may have an upper surface of which height relatively radically changes around the boundary between the first area R1 and the second area R2, as shown in FIG. 10E. However, when a loading effect occurs more gradually between the first area R1 and the second area R2, the upper surface of the mask pattern 190 may change at a gentler inclination over a longer distance in a horizontal direction.

Referring to FIG. 10F, a lower electrode material layer 151m may be formed in the recess patterns RS. The lower electrode material layer 151m may be formed by CVD or atomic layer deposition (ALD). The lower electrode material layer 151m may fill the inside of the recess patterns RS and may also cover an upper surface of the mask pattern 190. "An element A filling an element B" (or similar language) as used herein means that the element A is in the element B but does not necessarily mean that the element A fills the element B entirely.

The lower electrode material layer 151m may include, for example, cobalt (Co), titanium (Ti), nickel (Ni), tungsten (W), molybdenum (Mo), platinum (Pt), ruthenium (Ru), iridium (Ir), titanium nitride (TiN), tantalum nitride (TaN), titanium aluminum nitride (TiAlN), tantalum aluminum nitride (TaAlN), titanium silicon nitride (TiSiN), tungsten nitride (WN), platinum oxide (PtO), ruthenium oxide (RuOx), iridium oxide (IrO$_x$), SRO (SrRuO$_3$), BSRO ((Ba,Sr)RuO$_3$), CRO (CaRuO$_3$), LSCO ((La,Sr)CoO$_3$), or a combination thereof.

Referring to FIG. 10G, the lower electrodes 151 may be formed by partially removing the lower electrode material layer 151m. The lower electrodes 151 may be formed by etch-back (EB), chemical mechanical polishing (CMP), or a combination thereof.

In some embodiments, CMP may be first performed to reduce a difference between the height of the mask pattern 190 in the first area R1 and that in the second area R2. At this time, the lower electrode material layer 151m is partially removed, and thus the lower electrodes 151 separated from each other may be formed. Due to the CMP, a mask pattern 190p substantially having a flat upper surface may be obtained. When planarization is achieved via CMP, an upper surface of the mask pattern 190p may have a lower level in the first area R1 than in the second area R2, wherein the first area R1 has a pattern with a lower density than a dense pattern of the second area R2. This may be due to a loading effect. This level change of the upper surface of the mask pattern 190p according to locations may gradually occur. In particular, this level change may occur in a boundary area between the first area R1 and the second area R2 and the vicinity thereof.

In some embodiments, when the mask pattern 190 is planarized by etch-back instead of CMP, a level change opposite to that shown in FIG. 10G may occur. In other words, the upper surface of the mask pattern 190p may have a higher level in the first area R1 than in the second area R2 when the mask pattern 190 is planarized by etch-back.

The second area R2 includes a center area R2C and an edge area R2E. The edge area R2E may be between the center area R2C and the first area R1. The center area R2C may be defined as an area where vertical sizes of the lower electrodes 151 are substantially constant. In the edge area R2E, heights of lower electrodes (indicated by dashed lines of FIG. 10G) may not be uniform.

Referring to FIG. 10H, lower electrodes 151 protruding from an upper surface of the second mold layer 140m2 may be obtained by selectively removing the remaining mask pattern 190p. At this time, the remaining mask pattern 190p may be selectively removed by a dry cleaning process.

When the remaining mask pattern 190p is removed by dry etching, the second mold layer 140m2 may be damaged, and thus exposed surfaces of the lower electrodes 151 may be irregular. According to some embodiments of the present inventive concept, the remaining mask pattern 190p is removed by a dry cleaning process instead of dry etching. When the dry cleaning process is used, the remaining mask pattern 190p may be removed with a high selectivity with respect to the second mold layer 140m2.

The dry cleaning process may be performed when a bias is not applied by using a plasma gas including a radical of species such as fluorine. Accordingly, in the dry cleaning process, the mask pattern 190p may be removed isotropically. In some embodiments, in the dry cleaning process, the plasma gas may not include ions of species. In some embodiments, the dry cleaning process may be performed using a plasma gas without electrical bias. For example, during the dry cleaning process, an electrical bias may not be applied to the substrate 100. In some embodiments, the plasma gas may include fluorine radicals.

A plasma gas including a radical of species may be supplied to the mask pattern 190p after being generated by a remote method, but the inventive concept is not limited thereto. In some embodiments, a fluorine radical in the plasma gas may remove the mask pattern 190p by the dry cleaning process in which the fluorine radical reacts with silicon of polysilicon forming the mask pattern 190 as follows.

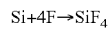

For example, $C_3F_8$, $C_2F_6$, or $CF_4$ may be used as a supply source of fluorine, but the inventive concept is not limited thereto.

In some embodiments, when the dry cleaning process is used, an etch selectivity between the remaining mask pattern 190p and the second mold layer 140m2 may be about 500:1 to about 1000:1, or about 700:1 to about 900:1. In other words, the amount of the remaining mask pattern 190p and the amount of the support layer 157 removed by the dry cleaning process may be about 500:1 to about 1000:1, or about 700:1 to about 900:1, with respect to the same period of time.

In some embodiments, lower electrodes 151e1m and 151e2m of the edge area R2E of the second area R2 may include upper portions with slightly less heights than those of lower electrodes 151 in the center area R2C of the second area R2. In other words, the level of the upper surfaces of the lower electrodes 151e1m and 151e2m of the edge area R2E may be lower than that of the upper surfaces of the lower electrodes 151 of the center area R2C. A lower electrode closer to the first area R1, from among the lower electrodes 151e1m and 151e2m of the edge area R2E, may have a lower upper surface than the other lower electrode. In some embodiments, a lower electrode closer to the first area R1, from among the lower electrodes 151e1m and 151e2m of the edge area R2E, may have a smaller vertical size than the other lower electrode. In some embodiments, the upper surfaces of the lower electrodes 151e1m and 151e2m of the edge area R2E may be closer to the substrate 100 than the upper surfaces of the lower electrodes 151 of the center area R2C as illustrated in FIG. 10.

In some embodiments, the lower electrodes 151e1m and 151e2m of the edge area R2E of the second area R2 may include upper portions with slightly greater heights than those of the lower electrodes 151 of the center area R2C of the second area R2. In other words, the level of the upper surfaces of the lower electrodes 151e1m and 151e2m of the edge area R2E may be higher than that of the upper surfaces of the lower electrodes 151 of the center area R2C. A lower electrode closer to the first area R1, from among the lower electrodes 151e1m and 151e2m of the edge area R2E, may have a higher upper surface than the other lower electrode. In some embodiments, a lower electrode closer to the first area R1, from among the lower electrodes 151e1m and 151e2m of the edge area R2E, may have a greater vertical size than the other lower electrode. In some embodiments, the upper surfaces of the lower electrodes 151 of the center area R2C may be closer to the substrate 100 than the upper surfaces of the lower electrodes 151e1m and 151e2m of the edge area R2E.

Referring to FIG. 10I, portions of the lower electrodes 151 may be removed to reduce the horizontal sizes of upper portions of the lower electrodes 151. A horizontal size of an element A may refer to a width of the element A in a horizontal direction.

The portions of the lower electrodes 151 may be removed by isotropic dry or wet etching. For example, when the portions of the lower electrodes 151 are removed by isotropic wet etching, an etchant including phosphoric acid, nitric acid, acetic acid, or a combination thereof may be used. In this case, exposed portions of the lower electrodes 151 may be isotropically etched out.

In some embodiments, the portions of the lower electrodes 151 may be removed such that a horizontal size of each of the lower electrodes 151 after etching may be about 60% to about 90% of a horizontal size of each of the lower electrodes 151 before etching.

In some embodiments, upper portions 151$u$ of the lower electrodes 151 may each extend in a direction perpendicular to the upper surface of the semiconductor substrate 100, as shown in FIG. 10I. In some embodiments, the upper portions 151$u$ of the lower electrodes 151 may have inclined lateral surfaces as shown in FIG. 6B or may have slightly convexly-curved lateral surfaces as shown in FIG. 6C.

In some embodiments, lower electrodes 151$e$1 and 151$e$2 of the edge area R2E of the second area R2 may have upper portions with slightly less heights than those of lower electrodes 151 of the center area R2C of the second area R2. In other words, the level of the upper surfaces of the lower electrodes 151$e$1 and 151$e$2 of the edge area R2E may be lower than that of the upper surfaces of the lower electrodes 151 of the center area R2C. A lower electrode closer to the first area R1, from among the lower electrodes 151$e$1 and 151$e$2 of the edge area R2E, may have a lower upper surface than the other lower electrode 151. In some embodiments, a lower electrode closer to the first area R1, from among the lower electrodes 151$e$1 and 151$e$2 of the edge area R2E, may have a smaller vertical size than the other lower electrode.

In some embodiments, the lower electrodes 151$e$1 and 151$e$2 of the edge area R2E of the second area R2 may have upper portions with slightly greater heights than those of the lower electrodes 151 of the center area R2C of the second area R2. In other words, the level of the upper surfaces of the lower electrodes 151$e$1 and 151$e$2 of the edge area R2E may be higher than that of the upper surfaces of the lower electrodes 151 of the center area R2C. A lower electrode closer to the first area R1, from among the lower electrodes 151$e$1 and 151$e$2 of the edge area R2E, may have a higher upper surface than the other lower electrode. In some embodiments, a lower electrode closer to the first area R1, from among the lower electrodes 151$e$1 and 151$e$2 of the edge area R2E, may have a greater vertical size than the other lower electrode.

Referring to FIG. 10J, a third mold layer 140$m$3 may be formed on the second mold layer 140$m$2. The third mold layer 140$m$3 may cover upper portions of the lower electrodes 151, 151$e$1, and 151$e$2.

The third mold layer 140$m$3 may include, for example, a silicon oxide, and may be formed, for example, by CVD. The third mold layer 140$m$3 may be formed by low pressure (LP) CVD or plasma enhanced CVD exhibiting a good step coverage. For example, the third mold layer 140$m$3 may include an HDP oxide film, TEOS, PE-TEOS, O$_3$-TEOS, USG, PSG, BSG, BPSG, FSG, SOG, TOSZ, or a combination thereof.

Referring to FIG. 10K, the third mold layer 140$m$3 may be partially removed to expose upper ends of the lower electrodes 151, 151$e$1, and 151$e$2. The third mold layer 140$m$3 may be partially removed by EB.

Referring to FIG. 10L, a second support material layer 157$bm$ may be formed on the third mold layer 140$m$3. The second support material layer 157$bm$ may cover the exposed upper ends of the lower electrodes 151, 151$e$1, and 151$e$2.

The second support material layer 157$bm$ may include, for example, at least one of SiN, SiCN, SiGe, TaO, and TiO$_2$ and may be formed by, for example, CVD or PVD.

Referring to FIG. 10M, the second support material layer 157$bm$ may be partially removed so that the upper surfaces or upper ends of the lower electrodes 151, 151$e$1, and 151$e$2 are exposed, thereby forming a second support layer 157$b$. In the case that the level of the upper surfaces of the lower electrodes 151$e$1 and 151$e$2 in the edge area R2E is lower than that of the upper surfaces of the lower electrodes 151 in the center area R2C as described above, the upper surfaces of the lower electrodes 151$e$1 and 151$e$2 in the edge area R2E may not be exposed.

The operation of partially removing the second support material layer 157$bm$ may be omitted, and accordingly, a semiconductor device including the second support layer 157$c$ contacting the upper surface and lateral surfaces of the lower electrodes 151 as shown in FIG. 8 may be obtained.

During the partial removal of the second support material layer 157$bm$, when the second support material layer 157$bm$ is sufficiently removed so that the upper ends of the lower electrodes 151 are exposed to protrude, the structure shown in FIG. 9 may be obtained.

Referring to FIG. 10N, the second support layer 157$b$, the third mold layer 140$m$3, the second mold layer 140$m$2, the first support layer 157$a$, and the first mold layer 140$m$1 in the first area R1 may be removed. Thereafter, the third, second, and first mold layers 140$m$3, 140$m$2, and 140$m$1 in the second area R2 may be removed to expose the lower electrodes 151, 151$e$1, and 151$e$2. The third, second, and first mold layers 140$m$3, 140$m$2, and 140$m$1 may be removed using, for example, a lift-off process using an etchant such as hydrofluoric acid. Even after the third, second, and first mold layers 140$m$3, 140$m$2, and 140$m$1 are removed, the lower electrodes 151, 151$e$1, and 151$e$2 may be supported by the first support layer 157$a$ and the second support layer 157$b$.

Referring to FIG. 10O, the dielectric layer 153 may be conformally formed on the exposed surfaces of the lower electrodes 151, 151$e$1, and 151$e$2. At this time, the dielectric layer 153 may also be formed on exposed surfaces of the first support layer 157$a$ and the second support layer 157$b$. The dielectric layer 153 may not be formed on portions of the surfaces of the lower electrodes 151, 151$e$1, and 151$e$2 that are in contact with the first support layer 157$a$ and the second support layer 157$b$.

The dielectric layer 153 may include, for example, a nitride, an oxide, a metal oxide, or a combination thereof. For example, the dielectric layer 153 may have a single-layered or multi-layered structure including a silicon nitride, a silicon oxide, a metal oxide such as, HfO$_2$, ZrO$_2$, Al$_2$O$_3$, La$_2$O$_3$, Ta$_2$O$_3$, or TiO$_2$, a dielectric material having a Perovskite structure such as STO (SrTiO$_3$), BST ((Ba,Sr)TiO$_3$), BaTiO$_3$, PZT, or PLZT, or a combination thereof. A detailed example of a multi-layered structure may include a structure of a zirconium oxide film/an aluminum oxide film/a zirconium oxide film (ZAZ) or a zirconium oxide film/an aluminum oxide film/a tantalum oxide film (ZAT).

In some embodiments, the dielectric layer 153 may have a thickness of about 5 nm to about 15 nm, but the inventive concept is not limited thereto. The dielectric layer 153 may be formed by, for example, CVD, PVD, or ALD.

Referring to FIG. 10P, the upper electrode 155 may be formed. The upper electrode 155 may be formed on the dielectric layer 153. The upper electrode 155 may include Co, Ti, Ni, W, Mo, Pt, Ru, Ir, TiN, TaN, TiAlN, TaAlN, TiSiN, WN, PtO, RuOx, IrOx, SRO(SrRuO$_3$), BSRO((Ba,Sr)RuO$_3$), CRO(CaRuO$_3$), LSCO((La,Sr)CoO$_3$), or a combination thereof. However, the material used to form the upper electrode 155 is not limited to the materials above.

The upper electrode 155 may be formed by, for example, CVD, MOCVD, PVD, or ALD.

The lower electrode 151, the dielectric layer 153, and the upper electrode 155 may constitute the capacitor 150.

A fourth interlayer insulating layer 160, which is the same as the burying insulating layer 160 in FIG. 5, may be further formed on the upper electrode 155, as necessary. The fourth interlayer insulating layer 160 may include, for example, an HDP oxide film, TEOS, PE-TEOS, O3-TEOS, USG, PSG, BSG, BPSG, FSG, SOG, TOSZ or a combination thereof. In some embodiments, the fourth interlayer insulating layer 160 may include a silicon nitride, a silicon oxynitride, or a low-k material having a low dielectric constant.

According to embodiments of the inventive concept, the size of a capacitor is increased by a thickness of the mask pattern 190, and consequently, a manufactured capacitor may have an increased capacitance. In addition, an interval between upper ends of lower electrodes of the capacitor is increased, thereby reducing or possibly preventing occurrence of a device defect.

Figure 11A:
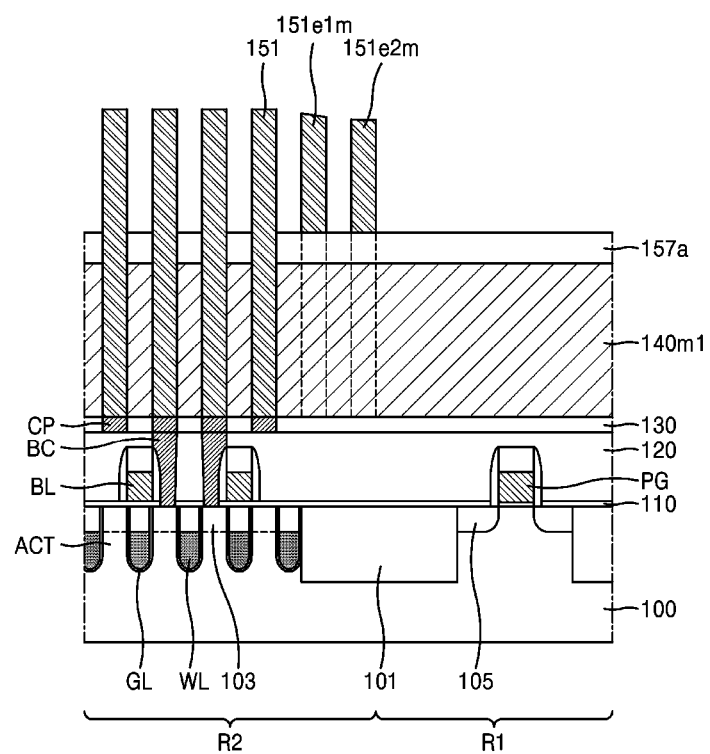
FIGS. 11A through 11I are side cross-sectional views illustrating a method of fabricating a semiconductor device according to some embodiments of the inventive concept.

FIGS. 11A through 11I are side cross-sectional views illustrating a method of fabricating a semiconductor device, according to some embodiments of the inventive concept. The operation shown in FIG. 11A is an operation subsequent to FIG. 10H, and the operations shown in FIGS. 10A through 10H may be performed before the operation shown in FIG. 11A is performed.

Referring to FIG. 11A, the second mold layer 140$m$2 may be removed to expose an upper surface of the first support layer 157$a$. For example, the second mold layer 140$m$2 may be removed by wet etching. In detail, the second mold layer 140$m$2 may be removed by an LAL solution, which is an etchant in which ammonium fluoride and hydrofluoric acid are mixed. In some embodiments, the second mold layer 140$m$2 may be removed by isotropic dry etching.

As described above with reference to FIG. 10H, the lower electrodes 151$e$1$m$ and 151$e$2$m$ of the edge area R2E of the second area R2 may have upper surfaces at a level that may be different from a level of the upper surfaces of the lower electrodes 151 of the center area R2C.

Figure 11B:
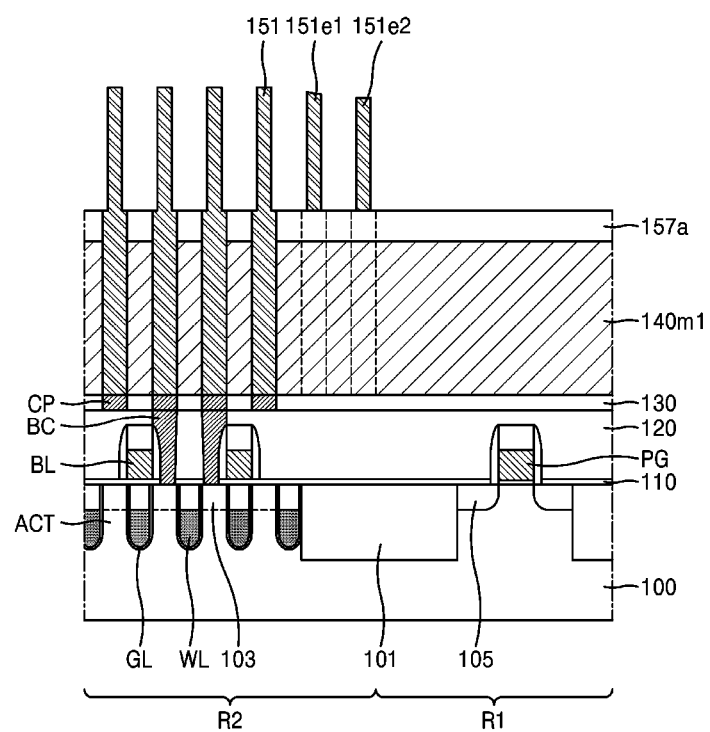

Referring to FIG. 11B, portions of the lower electrodes 151, 151$e$1$m$, and 151$e$2$m$ may be removed to reduce the horizontal sizes of upper portions of the lower electrodes 151, 151$e$1$m$, and 151$e$2$m$. This has been described above with reference to FIG. 10I, and thus a redundant description thereof will be omitted.

However, as shown in FIG. 11B, a level of shoulder portions of the lower electrodes 151, 151$e$1, and 151$e$2 having reduced horizontal sizes may be substantially the same as that of the upper surface of the first support layer 157$a$.

Figure 11C:
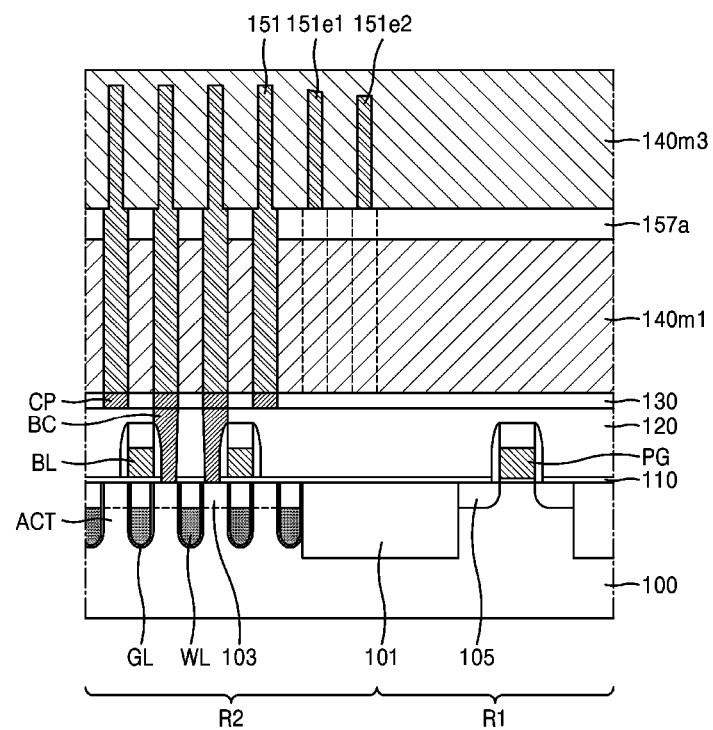

Referring to FIG. 11C, the third mold layer 140$m$3 may be formed on the first support layer 157$a$. The third mold layer 140$m$3 may cover the upper portions of the lower electrodes 151, 151$e$1, and 151$e$2. The third mold layer 140$m$3 has been described above with reference to FIG. 10J, and thus a detailed description thereof will be omitted.

Figure 11D:
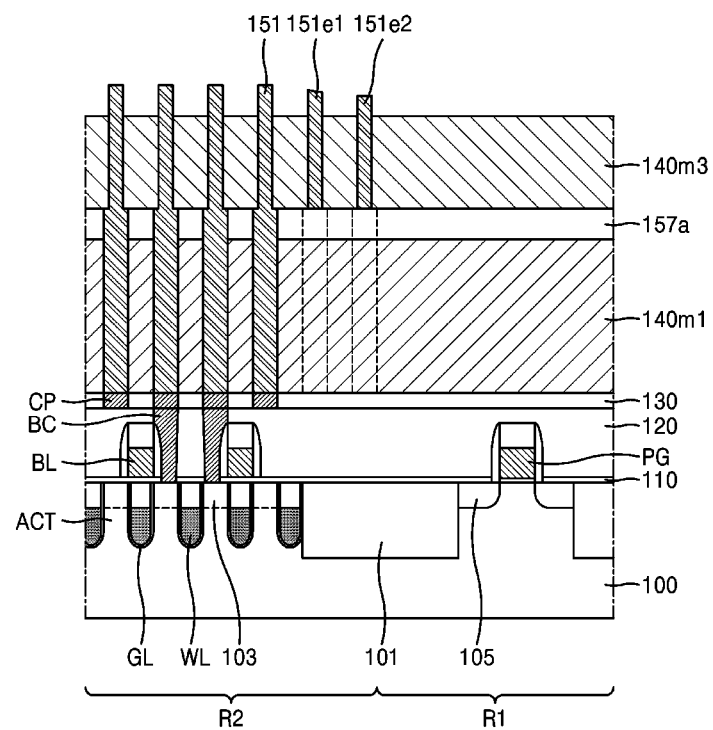

Referring to FIG. 11D, the third mold layer 140$m$3 may be partially removed to expose the upper ends of the lower electrodes 151, 151$e$1, and 151$e$2. The third mold layer 140$m$3 may be partially removed by EB.

Figure 11E:
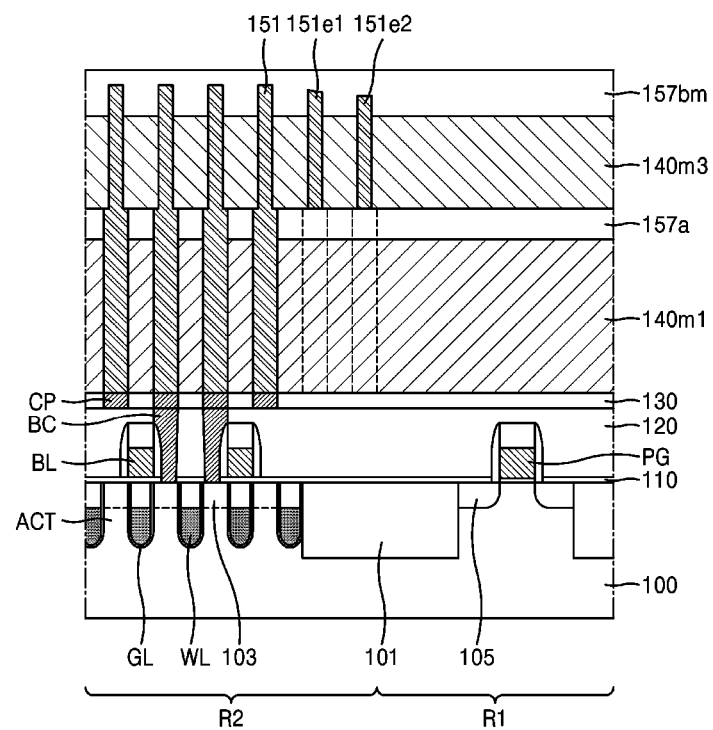

Referring to FIG. 11E, the second support material layer 157$bm$ may be formed on the third mold layer 140$m$3. The second support material layer 157$bm$ may cover the exposed upper ends of the lower electrodes 151, 151$e$1, and 151$e$2.

The second support material layer 157$bm$ may include, for example, at least one of SiN, SiCN, SiGe, TaO, and TiO$_2$ and may be formed by, for example, CVD or PVD.

Figure 11F:
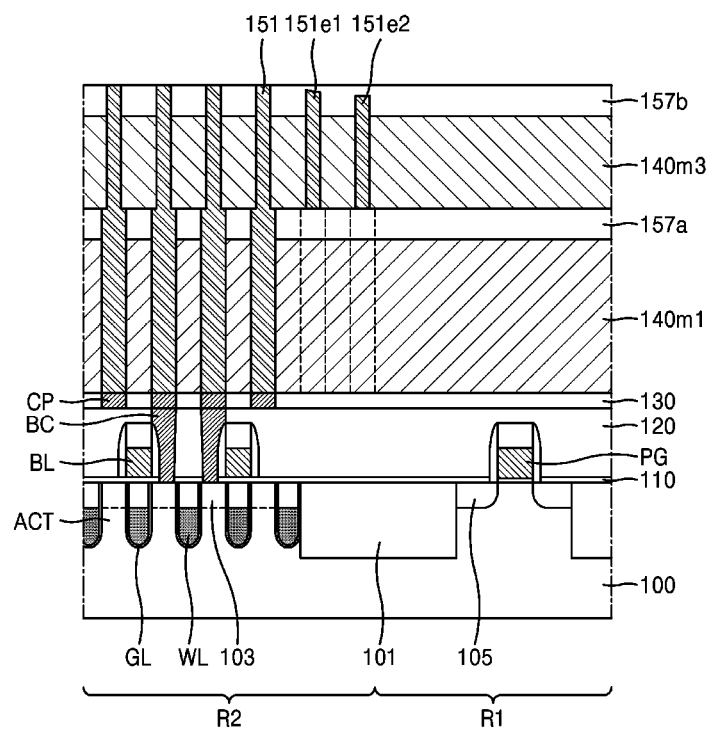

Referring to FIG. 11F, the second support material layer 157$bm$ may be partially removed so that the upper surfaces or upper ends of the lower electrodes 151, 151$e$1, and 151$e$2 are exposed, thereby forming the second support layer 157$b$. This has been described above with reference to FIG. 10M, and thus a detailed description thereof will be omitted.

Figure 11G:
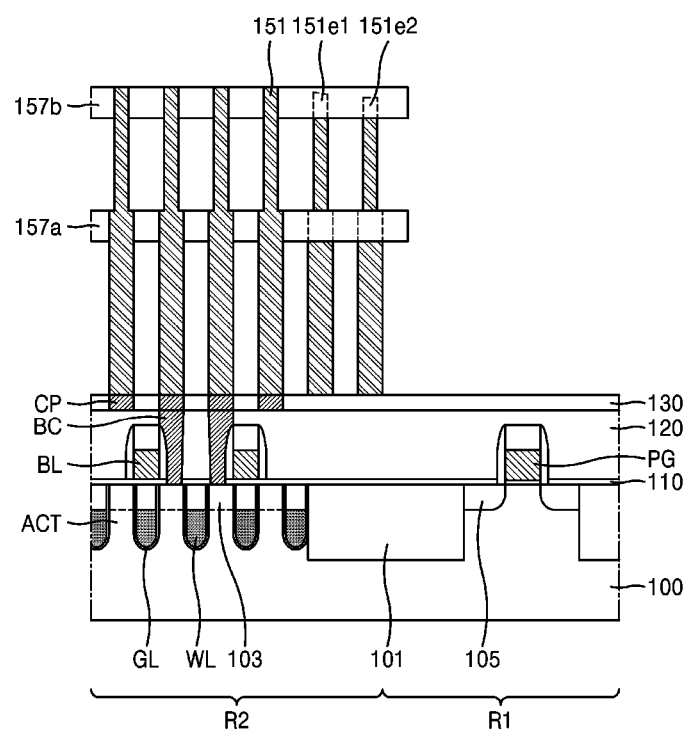

Referring to FIG. 11G, the second support layer 157$b$, the third mold layer 140$m$3, the first support layer 157$a$, and the first mold layer 140$m$1 in the first area R1 may be removed. Thereafter, the third and first mold layers 140$m$3 and 140$m$1 in the second area R2 may be removed to expose the lower electrodes 151, 151$e$1, and 151$e$2. This has been described above with reference to FIG. 10N, and thus a detailed description thereof will be omitted.

Figure 11H:
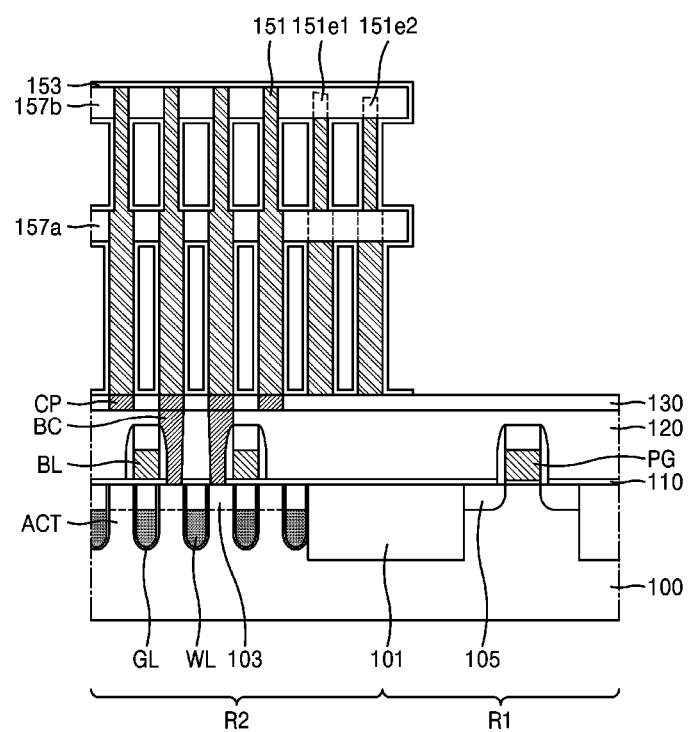

Referring to FIG. 11H, the dielectric layer 153 may be conformally formed on the exposed surfaces of the lower electrodes 151, 151$e$1, and 151$e$2. At this time, the dielectric layer 153 may also be formed on the exposed surfaces of the first support layer 157$a$ and the second support layer 157$b$. The dielectric layer 153 may not be formed on portions of the surfaces of the lower electrodes 151, 151$e$1, and 151$e$2 that are in contact with the first support layer 157$a$ and the second support layer 157$b$. This has been described above with reference to FIG. 10O, and thus a redundant description thereof will be omitted.

Figure 11I:
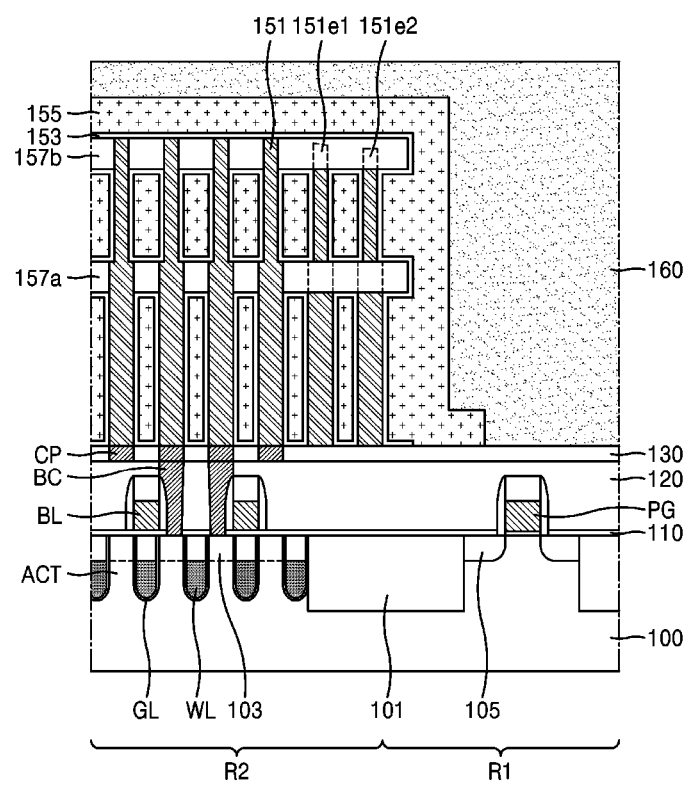

Referring to FIG. 11I, the upper electrode 155 may be formed on the dielectric layer 153. This has been described above with reference to FIG. 10P, and thus a redundant description thereof will be omitted.

The fourth interlayer insulating layer 160 may be further formed on the upper electrode 155, as necessary.

While some example embodiments have been described with reference to the figures, it will be understood by those of ordinary skill in the art that various changes in form and details may be made therein without departing from the spirit and scope of the inventive concept as defined by the following claims.

Accordingly, the above-disclosed subject matter is to be considered illustrative, and not restrictive, and the appended claims are intended to cover all such modifications, enhancements, and other embodiments, which fall within the spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A capacitor forming method comprising:
sequentially forming a first mold layer, a first support material layer, and a second mold layer on a substrate;
forming a mask pattern on the second mold layer;
forming a recess in the second mold layer, the first support material layer, and the first mold layer using the mask pattern as a mask;

forming a lower electrode in the recess; removing the mask pattern by a dry cleaning process; reducing a width of an upper portion of the lower electrode;
removing the first mold layer; forming a dielectric layer on a surface of the lower electrode; and
forming an upper electrode on the dielectric layer,
wherein the method further comprises removing a portion of the second mold layer, before the reducing of the width of the upper portion of the lower electrode and after the removing of the mask pattern.

2. The capacitor forming method of claim 1, further comprising, before the removing of the first mold layer, forming a second support material layer.

3. The capacitor forming method of claim 2, further comprising forming a third mold layer on the first support material layer, after the reducing of the width of the upper portion of the lower electrode and before the forming of the second support material layer.

4. The capacitor forming method of claim 3, wherein the second support material layer is formed on the third mold layer.

5. The capacitor forming method of claim 4, further comprising removing a portion of the third mold layer to expose the upper portion of the lower electrode, before the forming of the second support material layer.

6. The capacitor forming method of claim 5, wherein the second support material layer is formed to cover an upper surface of the lower electrode and a portion of a side surface of the upper portion of the lower electrode.

7. The capacitor forming method of claim 5, wherein the second support material layer is formed to expose an upper surface of the lower electrode and to cover a portion of a side surface of the upper portion of the lower electrode.

8. The capacitor forming method of claim 1, wherein the dry cleaning process is a plasma cleaning process in which no electrical biases are applied.

9. The capacitor forming method of claim 1, wherein after the reducing of the width of the upper portion of the lower electrode, an upper end of the lower electrode has a width in a range of about 60% to about 90% of a width of a lower portion of the lower electrode.

10. A method of fabricating a semiconductor device, the method comprising:
sequentially forming a first mold layer, a first support material layer, and a second mold layer on a substrate;
forming a mask pattern on the second mold layer;
forming a recess in the first mold layer, the first support material layer, and the second mold layer by patterning the first mold layer, the first support material layer, and the second mold layer using the mask pattern as a mask;
forming a lower electrode in the recess; removing the mask pattern by a dry cleaning process to expose an upper portion of the lower electrode;
reducing a width of the upper portion of the lower electrode;
removing the first mold layer; forming a dielectric layer on a surface of the lower electrode; and
forming an upper electrode on the dielectric layer,
wherein the method further comprises removing a portion of the second mold layer, after the removing of the mask pattern and before the reducing of the width of the upper portion of the lower electrode.

11. The method of claim 10, wherein the lower electrode has a cylindrical shape.

12. The method of claim 10, wherein after the reducing of the width of the upper portion of the lower electrode, an upper end of the lower electrode has a width in a range of about 60% to about 90% of a width of a lower portion of the lower electrode.

13. The method of claim 10, wherein the reducing of the width of the upper portion of the lower electrode is performed by wet etching.

14. The method of claim 10, wherein an upper surface of the lower electrode is coplanar with an upper surface of the mask pattern.

15. A method of fabricating a semiconductor device, the method comprising:
forming a transistor comprising a gate structure and an impurity area on a substrate;
forming, on the substrate, an interlayer insulating layer that covers the transistor and comprises a contact plug electrically connected to the impurity area;
sequentially forming a first mold layer, a first support material layer, and a second mold layer on the interlayer insulating layer; forming a mask pattern on the second mold layer;
forming a recess in the first mold layer, the first support material layer, and the second mold layer using the mask pattern as a mask;
forming a lower electrode material layer on an upper surface of the mask pattern and in the recess;
forming a lower electrode by removing a portion of the lower electrode material layer until the upper surface of the mask pattern is exposed;
removing the mask pattern by a dry cleaning process;
reducing a width of an upper portion of the lower electrode; removing the first mold layer;
forming a dielectric layer on a surface of the lower electrode; and
forming an upper electrode on the dielectric layer,
wherein the method further comprises removing a portion of the second mold layer, after the removing of the mask pattern and before the reducing of the width of the upper portion of the lower electrode.

16. The method of claim 10, wherein removing the mask pattern exposes an entirety of a side surface of the upper portion of the lower electrode, and
wherein reducing the width of the upper portion of the lower electrode comprises etching the side surface of the upper portion of the lower electrode by performing an isotropic etching process.

17. The method of claim 10, further comprising, before sequentially forming the first mold layer, the first support material layer, and the second mold layer:
forming a transistor comprising a gate structure and an impurity area on the substrate; and
forming an interlayer insulating layer extending on the transistor and comprising a contact plug electrically connected to the impurity area.

18. The method of claim 10, wherein removing the portion of the second mold layer comprises removing the second mold layer until an upper surface of the first support material layer is exposed, and the upper portion of the lower electrode protrudes above the upper surface of the first support material layer after removing the portion of the second mold layer, and wherein reducing the width of the upper portion of the lower electrode comprises etching a side surface of the upper portion of the lower electrode by performing an isotropic etching process.

* * * * *